(12) United States Patent
Mak et al.

(10) Patent No.: US 9,374,063 B1
(45) Date of Patent: Jun. 21, 2016

(54) GAIN-BOOSTED N-PATH BANDPASS FILTER

(71) Applicant: University of Macau, Macau (CN)

(72) Inventors: Pui-In Mak, Macau (CN); Zhicheng Lin, Macau (CN); Rui Paulo da Silva Martins, Macau (CN)

(73) Assignee: UNIVERSITY OF MACAU, Macau (CN)

( * ) Notice: Subject to any disclaimer, the term of this patent is extended or adjusted under 35 U.S.C. 154(b) by 0 days.

(21) Appl. No.: 14/726,881

(22) Filed: Jun. 1, 2015

Related U.S. Application Data

(60) Provisional application No. 62/112,363, filed on Feb. 5, 2015.

(51) Int. Cl.
  *H03H 19/00* (2006.01)
  *H03H 11/04* (2006.01)
  *H03H 11/12* (2006.01)

(52) U.S. Cl.
  CPC ....... *H03H 11/0427* (2013.01); *H03H 11/1291* (2013.01); *H03H 19/004* (2013.01)

(58) Field of Classification Search
  CPC .......... H03H 11/0427; H03H 11/0455; H03H 11/0461; H03H 11/04; H03H 11/1291; H03H 11/12; H03H 19/004; H03H 2210/021; H03M 3/386; H03M 3/458
  See application file for complete search history.

(56) References Cited

U.S. PATENT DOCUMENTS

| 4,733,205 | A | * | 3/1988 | Hughes | H03H 11/04 330/109 |
|---|---|---|---|---|---|
| 5,187,445 | A | * | 2/1993 | Jackson | H03H 11/04 327/553 |
| 5,914,633 | A | * | 6/1999 | Comino | H03H 11/1291 327/552 |
| 8,299,850 | B1 | * | 10/2012 | Kutz | H03K 25/04 330/260 |
| 2006/0170460 | A1 | * | 8/2006 | Kawasumi | G11C 7/065 327/52 |

OTHER PUBLICATIONS

Z. Lin, P.-I. Mak and R. P. Martins, "A 0.5V 1.15mW 0.2mm2 Sub-GHz ZigBee Receiver Supporting 433/860/915/960MHz ISM Bands with Zero External Components," ISSCC Dig. Tech. Papers, pp. 164-165, Feb. 2014.

(Continued)

*Primary Examiner* — Jung Kim
(74) *Attorney, Agent, or Firm* — Bacon & Thomas, PLLC

(57) ABSTRACT

The present invention discloses a gain-boosted N-path SC bandpass filter (GB-BPF) with a number of sought features. It is based on a transconductance amplifier ($G_m$) with an N-path SC branch as its feedback network, offering 1) double RF filtering at the input and output of the $G_m$ in one step; 2) customized passband gain and bandwidth with input-impedance match, and 3) reduced physical capacitance thanks to the loop gain offered by $G_m$. All have been examined using a RLC model of the SC branch before applying the linear periodically time-variant (LPTV) analysis to derive the R, L and C expressions and analytically study the harmonic selectivity, harmonic folding and noise. The latter reveals that: 1) the noise due to the switches is notched at the output, allowing smaller switches to save the LO power; and 2) the noises due to the source resistance and $G_m$ are narrowband at the output, reducing the folded noise during harmonic mixing.

4 Claims, 17 Drawing Sheets

(56) References Cited

OTHER PUBLICATIONS

Z. Lin, P.-I. Mak and R. P. Martins, "A 1.7mW 0.22mm2 2.4GHz ZigBee RX Exploiting a Current-Reuse Blixer + Hybrid Filter Topology in 65nm CMOS," ISSCC Dig. Tech. Papers, pp. 448-449, Feb. 2013.
F. Lin, P.-I. Mak and R. P. Martins, "An RF-to-BB Current-Reuse Wideband Receiver with Parallel N-Path Active/Passive Mixers and a Single-MOS Pole-Zero LPF," ISSCC Dig. Tech. Papers, paper 3.9, Feb. 2014.
F. Zhang, K. Wang, J. Koo, Y. Miyahara and B. Otis, "A 1.6mW 300mV Supply 2.4 GHz Receiver with −94 dBm Sensitivity for Energy-Harvesting Applications," ISSCC Dig. Tech. Papers, pp. 456-457, Feb. 2013.
A. Ghaffari, E. Klumperink, M. Soer and B. Nauta, "Tunable High-Q N-Path Band-Pass Filters: Modeling and Verification," IEEE J. Solid-State Circuits, vol. 46, pp. 998-1010, May 2011.
J. Sinderen, G. Jong, F. Leong, et al., "Wideband UHF ISM-Band Transceiver Supporting Multichannel Reception and DSSS Modulation," ISSCC Dig. Tech. Papers, pp. 454-455, Feb. 2013.
M. Tedeschi, A. Liscidini and R. Castello, "Low-Power Quadrature Receiver for ZigBee (IEEE 802.15.4) Applications," IEEE J.Solid-State Circuits, vol. 45, pp. 1710-1719, Sep. 2010.
Z. Lin, P.-I. Mak and R. P. Martins, "Analysis and Modeling of a Gain-Boosted N-Path Switched-Capacitor Bandpass Filter," IEEE Trans. Circuits Syst. I, Reg. Papers, vol. 9, pp. 2560-2568, Sep. 2014.
C. Andrews and A. Molnar, "A Passive Mixer-First Receiver with Digitally Controlled and Widely Tunable RF Interface," IEEE J. of Solid-State Circuits, vol. 45, pp. 2696-2708, Dec. 2010.
C. Andrews and A. Molnar, "Implications of Passive Mixer Transparency for Impedance Matching and Noise Figure in Passive Mixer-First Receivers," IEEE Trans. Circuits Syst. I, Reg. Papers, vol. 57, pp. 3092-3103, Dec. 2010.
D. Murphy, H. Darabi, A. Abidi, A. Hafez, A. Mirzaei, M. Mikhemar, and M. Chang, "A Blocker-Tolerant, Noise-Cancelling Receiver Suitable for Wideband Wireless Applications," IEEE J. of Solid-State Circuits, vol. 47, No. 12, pp. 2943-2963, Dec. 2012.
M. Darvishi, R. van der Zee, and B. Nauta, "Design of Active N-Path filters," IEEE J. of Solid-State Circuits, vol. 48, No. 12, pp. 2962-2976, Dec. 2013.
A. Mirzaei, H. Darabi, A. Yazdi, Z. Zhou, E. Chang, and P. Suri, "A 65 nm CMOS Quad-Band SAW-Less Receiver SOC for GSM/GPRS/EDGE," IEEE J. Solid-State Circuits, vol. 46, No. 4, pp. 950-964, Apr. 2011.
A. Mirzaei, H. Darabi and D. Murphy, "A Low-Power Process-Scalable Superheterodyne Receiver with Integrated High-Q filters," ISSCC Dig. Tech. Papers, pp. 60-61, Feb. 2011.
S. Youssef, R. van der Zee, and B. Nauta, "Active Feedback Technique for RF Channel Selection in Front-End Receivers" IEEE J. Solid-State Circuits, vol. 47, pp. 3130-3144, Dec. 2012.
M. Darvishi, R. van der Zee, E. Klumperink, and B. Nauta, "Widely Tunable 4th Order Switched Gm-C Band-Pass Filter Based on N-Path Filters," IEEE J. Solid-State Circuits, vol. 47, No. 12, pp. 3105-3119, Dec. 2012.
M. Soer, E. Klumperink, P. deBoer, F. vanVliet, and B. Nauta, "Unified Frequency Domain Analysis of Switched-Series-RC Passive Mixers and Samplers," IEEE Trans. Circuits Syst. I, Reg. Papers, vol. 57, No. 10, pp. 2618-2631, Oct. 2010.
A. Ghaffari, E. Klumperink, M. Soer, and B. Nauta, "Tunable N-Path Notch Filters for Blocker Suppression: Modeling and Verification," IEEE J. Solid-State Circuits, vol. 48, pp. 1370-1382, Jun. 2013.
A. Mirzaei and H. Darabi, "Analysis of Imperfections on Performance of 4-Phase Passive-Mixer-Based High-Q Bandpass Filters in SAWless Receivers," IEEE Trans. Circuits Syst. I, Reg. Papers, vol. 58, No. 5, pp. 879-892, May 2011.
A. Mirzaei, H Darabi, J. Leete et al., "Analysis and Optimization of Direct-Conversion Receivers With 25% Duty-Cycle Current-Driven Passive Mixers," IEEE Trans. Circuits Syst. I, Reg. Papers, vol. 57, pp. 2353-2366, Sep. 2010.
A. Mirzaei, H. Darabi, H., D. Murphy, "Architectural Evolution ofIntegrated M-Phase High-Q Bandpass Filters," IEEE Trans. Circuits Syst. I, Reg. Papers, vol. 59, No. 1, pp. 52-65, Jan. 2012.
Lin, P.-I. Mak and R. P. Martins, "A Sub-GHz Multi-ISM-Band ZigBee Receiver Using Function-Reuse and Gain-Boosted N-Path Techniques for IoT Applications", IEEE Journal of Solid-State Circuits, vol. 49, issue 12, pp. 2990-3004, Dec. 2014.
J. A. Stankovic, "Research Directions for the Internet of Things," IEEE Internet of Things Journal, vol. 1, No. 1, pp. 3-9, Feb. 2014.
A. Zanella, N. Bui, A. Castellani, L. Vangelista and M. Zorzi, "Internet of Things for Smart Cities," IEEE Internet of Things Journal, vol. 1, No. 1, pp. 22-32, Feb. 2014.
A. Wong, M. Dawkins, G. Devita, et. al., "A 1V 5mA Multimode IEEE 802.15.6/Bluetooth Low-Energy WBAN Transceiver for Biotelemetry Applications," ISSCC Dig. Tech. Papers, pp. 300-301, Feb. 2012.
B. W. Cook, A. Berny, A. Molnar, S. Lanzisera, and K. Pister, "Low-Power, 2.4-GHz Transceiver with Passive RX Front-End and 400-mV Supply," IEEE J. of Solid-State Circuits, vol. 41, pp. 2767-2775, Dec. 2006.
Z. Lin, P.-I. Mak and R. P. Martins, "A 0.14-mm2 1.4-mW 59.4-dB-SFDR 2.4GHz ZigBee/WPAN Receiver Exploiting a "Split-LNTA+50% LO" Topology in 65-nm CMOS," IEEE Trans. Microw. Theory Techn., vol. 62, No. 7, pp. 1525-1534, Jul. 2014.
J. Han and R. Gharpurey, "Recursive Receiver Down-Converters With Multiband Feedback and Gain-Reuse" IEEE J. of Solid-State Circuits, vol. 43, pp. 1119-1131, Sep. 2008.
F. Zhang, Y. Miyahara and B. Otis, "Design of a 300-mV 2.4-GHz Receiver Using Transformer-Coupled Techniques," IEEE J. of Solid-State Circuits, vol. 48, pp. 3190-3205, Dec. 2013.
Z. Lin, P.-I. Mak and R. P. Martins, "A 2.4-GHz ZigBee Receiver Exploiting an RF-to-BB-Current-Reuse Blixer + Hybrid Filter Toploly in 65-nm CMOS," IEEE J. of Solid-State Circuits, vol. 49, pp. 1333-1344, Jun. 2014.

\* cited by examiner

1/Ts
Tunable Resonant

1/Ts
Tunable Resonant

GAIN-BOOSTED N-PATH BANDPASS FILTER

BACKGROUND OF THE INVENTION

1. Field of the Invention

The present invention relates to a bandpass filter, especially relates to a gain-boosted N-path switched-capacitor (SC) bandpass filter.

2. Description of the Prior Art

The demand of highly-integrated multi-band transceivers has driven the development of blocker-tolerant software-defined radios that can avoid the cost (and loss) of the baluns and SAW filters. The passive-mixer-first receivers achieve a high out-of-band (OB) linearity (IIP3=+25 dBm) by eliminating the forefront low-noise amplifier (LNA). However, in the absence of RF gain, a considerable amount of power is entailed for the local oscillator (LO) to drive up the mixers that must be essentially large (i.e., small on-resistance, Rsw) for an affordable noise figure (NF<5 dB). The noise-cancelling receiver breaks such a NF-linearity tradeoff, by noise-cancelling the main path via a high-gain auxiliary path, resulting in better NF (1.9 dB). However, due to the wideband nature of all RF nodes, the passive mixers of the auxiliary path should still be large enough for a small Rsw (10 Ω) such that the linearity is upheld (IIP3=+13.5 dBm). Indeed, it would be more effective to perform filtering at the antenna port.

An N-path switched-capacitor (SC) branch applied at the antenna port corresponds to direct filtering that enhances OB linearity, although the sharpness and ultimate rejection are limited by the capacitor size and non-zero Rsw that are tight tradeoffs with the area and LO power, respectively. Repeatedly adopting such filters at different RF nodes can raise the filtering order, but at the expense of power and area.

Active-feedback frequency translation loop is another technique to enhance the area efficiency (0.06 mm2), narrowing RF bandwidth via signal cancellation, instead of increasing any RC time-constant. Still, the add-on circuitry (amplifiers and mixers) penalizes the power (62 mW) and NF (>7 dB). At the expense of more LO power and noise, the output voltages can be extracted from the capacitors via another set of switches, avoiding the effects of $R_{sw}$ on the ultimate rejection, but the problem of area remains unsolved.

SUMMARY OF THE INVENTION

In view of the deficiencies of the prior-art techniques, the object of the present invention is to provide a gain-boosted n-path bandpass filter so as to provide a much smaller capacitors for a given bandwidth.

According the one object of the present invention, provides a gain-boosted n-path bandpass filter, comprising: a transconductance amplifier; a node one, connected to an input of the transconductance amplifier; a node two, connected to an output of the transconductance amplifier; and a n-path sc branch, connected between the node one and the node two and parallel to the transconductance amplifier; wherein the n-path sc branch comprises a plurality of switches and capacitors connected in series.

According to one aspect of the present invention, the n-path sc branch is driven by the switches.

According to another aspect of the present invention, when the state of the switches is ON, an in-phase voltage of the transconductance amplifier will appear on top plates of the capacitors, and induce an amplified anti-phase voltage into bottom plates of the capacitors.

According to another aspect of the present invention, when the state of the switch is OFF, the amplified anti-phase voltage will be stored in the capacitors.

In view of the above, the present invention may have one or more of the following advantages:

1. The present invention have tunability of center frequency, passband gain and bandwidth without affecting the input-impedance matching.

2. The present invention have lower LO power as the pitfall of big $R_{sw}$ that can be leveraged by other design freedoms.

3. The present invention have much smaller capacitors for a given bandwidth thanks to the gain-boosting effects.

BRIEF DESCRIPTION OF THE DRAWINGS

In the following, the invention will be described in greater detail by means of preferred embodiments and with reference to the attached drawings, in which.

DETAILED DESCRIPTION OF THE PREFERRED EMBODIMENT

I. GB-BPF using an Ideal RLC Model

Figure 1A:
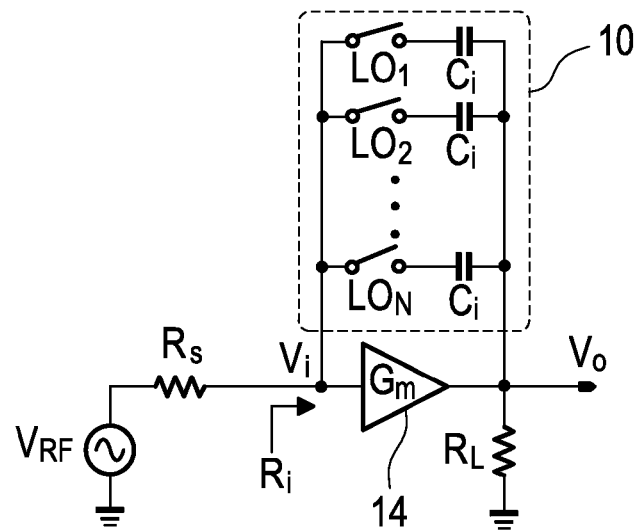
FIG. 1(a) illustrates a gain-boosted N-path SC bandpass filter (GB-BPF)
Figure 1B:
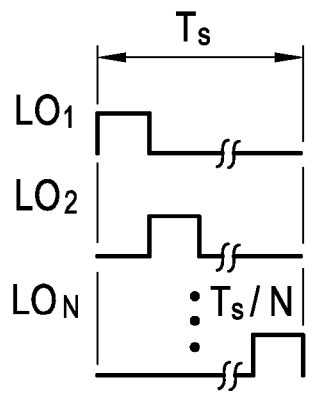
FIG. 1(b) illustrates a timing diagram of an N-phase non-overlapped LO in FIG. 1(a)

The proposed GB-BPF is depicted in FIG. 1(a). It features a transconductance amplifier ($G_m$) 14 in the forward path, and an N-path SC branch 10 driven by an N-phase non-overlapped LO in the feedback path. When one of the switches is ON, an in-phase RF voltage $V_{RF}$ will appear on the top plate of capacitor $C_i$, and induces an amplified anti-phase voltage into its bottom plate. When the switch is OFF, the amplified version of $V_{RF}$ will be stored in $C_i$. There are three observations: 1) similar to the well-known capacitor-multiplying technique (i.e., Miller effect) in amplifiers, the effective capacitance of $C_i$ at the input node $V_i$ will be boosted by the loop gain created by $G_m$ 14, while it is still $C_i$ at the output node $V_o$. This feature, to be described later, reduces the required $C_i$ when comparing it with the traditional passive N-path filter. 2) For the in-band signal, the voltages sampled at all $C_i$ are in-phase summed at $V_i$ and $V_o$ after a complete LO switching period ($T_s$) (shown in FIG. 1(b)), while the OB blockers are cancelled to each other, resulting in double filtering at two RF nodes in one step. 3) As the switches are located in the feedback path, their effects to the OB rejection should be reduced when comparing it with the passive N-path filter.

Figure 1C:
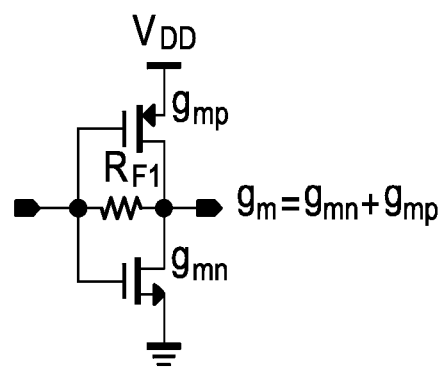
FIG. 1(c) illustrates a internal circuit diagram of the transconductance amplifier in the FIG. 1(a)
Figure 1D:
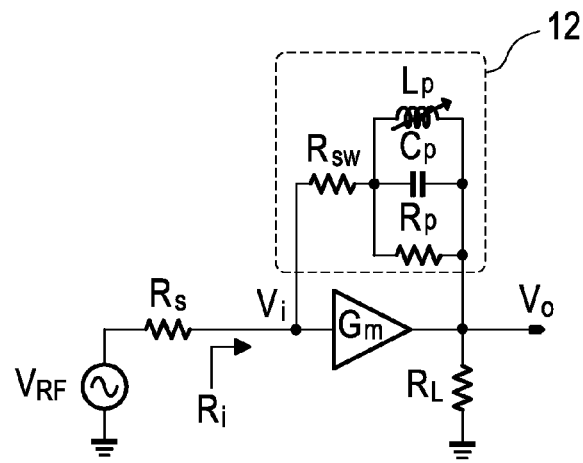
FIG. 1(d) illustrates a equivalent RLC circuit of the GB-BPF in FIG. 1(a) with the LC resonant tunable by the LO, wherein Rsw is the mixer switch's on-resistance.
Figure 1E:
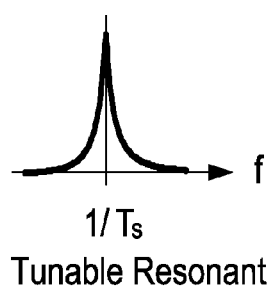
FIG. 1(e) illustrates the tunable resonance at $V_i$ in FIG. 1(a)
Figure 1F:
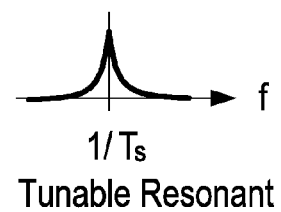
FIG. 1(f) illustrates the tunable resonance at $V_o$ in FIG. 1(a)

Referring now to FIG. 1(c) together with FIG. 1(a), for simplicity, $G_m$ 14 is assumed as an inverter amplifier with an effective transconductance of $g_m$. It is self-biased by the resistor $R_{F1}$ and has a finite output resistance explicitly modeled as $R_L$. The parasitic effects will be discussed in Section II-C. With both passband gain and resistive input impedance, the GB-BPF can be directly connected to the antenna port for matching with the source impedance $R_S$. Referring now to FIG. 1(d) together with FIG. 1(a), around the switching frequency ($\omega_s$), the N-path SC branch 10 is modeled as an $R_p$-$L_p$-$C_p$ parallel network in series with $R_{sw}$, where $L_p$ is a function of $\omega_s$ and will resonate with $C_p$ at $\omega_s$ [FIG. 1(d)]. The expressions of $R_p$, $L_p$ and $C_p$ will be derived in Section II-C. Here, the filtering behavior and −3-dB bandwidth at $V_i$ and $V_o$ will be analyzed.

A. RF Filtering at $V_i$ and $V_o$

With $V_{RF}$ centered at frequency $f_{RF}=f_s=\omega_s/2\pi$, $L_p$ and $C_p$ are resonated out, yielding an input resistance $R_i|_{@fs}$ that can be sized to match $R_S$ for the in-band signal, $$R_{i|@f_s} = \frac{(R_p + R_{sw}) // R_{F1} + R_L}{1 + g_m R_L} = R_S. \quad (1)$$

For the OB blockers located at $f_{RF}=f_s\pm\Delta f_s$, either $L_p$ or $C_p$ will become a short circuit when $\Delta f_s$ is large enough, $$R_{i|@f_s \pm \Delta f_s} = \frac{(R_{sw} // R_{F1}) + R_L}{1 + g_m R_L} \quad (2)$$
$$\approx \frac{R_{sw} + R_L}{1 + g_m R_L} \approx \frac{R_{sw}}{g_m R_L} + \frac{1}{g_m},$$

where $R_{F1} \gg R_{sw}$ and $g_m R_L \gg 1$ are applied and reasonable to simplify (2). To achieve stronger rejection of OB blockers at $V_i$, a small $R_i|_{@f_s\pm\Delta f_s}$ is expected. Unlike the traditional passive N-path filter where the OB rejection is limited by $R_{sw}$, this work can leverage it with three degrees of freedom: $g_m$, $R_L$ and $R_{sw}$. As a GB-BPF at the forefront of a receiver, a large $g_m$ is important to lower the NF of itself and its subsequent circuits. As an example, with $g_m=100$ mS, the product of $g_m R_L$ can reach 8 V/V with $R_L=80$ Ω. Thus, if $R_{sw}=20$ Ω is assumed, we obtain $R_i|_{@f_s\pm\Delta f_s}=12.5$ Ω, which is only 62.5% of $R_{sw}$. If $g_m$ is doubled (i.e., more power) while maintaining the same $g_m R_L$, $R_i|_{@f_s\pm\Delta f_s}$ is reduced to 7.5 Ω. Another way to trade the OB rejection with power is to adopt a multi-stage amplifier as $G_m$, which can potentially decouple the limited $g_m R_L$-product of a single-stage amplifier in nanoscale CMOS.

OB filtering not only happens at $V_i$, but also $V_o$. Hence, with one set of switches, double filtering is achieved in this work, leading to higher power and area efficiency than the traditional cascade design (i.e., two SC branches separately applied for $V_i$ and $V_o$). Likewise, the gain at $V_o$ at the resonance can be found as, $$A_{vo|@f_S} = \frac{V_o}{V_{RF}} = \frac{R_L(1 - g_m R_T)}{2R_S(1 + g_m R_L)} \approx \frac{R_L(1 - g_m R_T)}{2R_S g_m R_L}, \quad (3)$$

where $R_T = R_{F1}//(R_p + R_{sw})$ and $g_m R_L \gg 1$ are applied. In terms of stability, (3) should be negative or zero, i.e., $g_m R_T \geq 1$. Similarly, the gain at $V_o$ at $f_s \pm \Delta f_s$ is derived when $L_p$ or $C_p$ is considered as a short circuit, $$\frac{V_o}{V_{RF}}\bigg|_{@f_s \pm \Delta f_s} = \frac{1 - g_m R_{sw}}{1 + g_m R_S + \frac{R_S}{R_L} + \frac{R_{sw}}{R_L}}. \quad (4)$$

Interestingly, if $g_m R_{sw} = 1$, the OB filtering is infinite. This is possible because the feedback network is frequency selective, implying that the in-band signal and OB blockers can see different feedback factors. This fact differentiates this circuit from the traditional resistive-feedback wideband LNAs that cannot help to reject the OB blockers.

To exemplify, the circuit of FIG. 1(a) is simulated for N=4, using PSS and PAC analyses in SpectreRF. The parameters are: $R_{sw}=20\,\Omega$, $R_L=80\,\Omega$, $R_S=50\,\Omega$, $C_i=5$ pF and $f_s=1$ GHz. As expected, higher selectivity at $V_i$ [FIG. 2(a)] and $V_o$ [FIG. 2(b)] can be observed when $g_m$ (100 to 800 mS) and $R_{F1}$ (500 to 8 kΩ) are concurrently raised, while preserving the in-band $S_{11} < -20$ dB. [FIG. 2(c)]. Alternatively, when $R_{sw}$ goes up from 10 to 50 Ω, with other parameters unchanged, it can be observed that the influence of $R_{sw}$ to the OB rejection is relaxed at both $V_i$ [FIG. 3(a)] and $V_o$ [FIG. 3(b)], being well-consistent with (2) and (4). When $R_{sw}=10\,\Omega$, a much stronger OB rejection is due to $g_m R_{sw}=1$ in (4).

B. –3-dB Bandwidth at $V_i$ and $V_o$

At frequency $f_{RP} = f_s$, we can write $$\frac{V_i}{V_{RF}}\bigg|_{@f_s} = 1/2$$

when $R_i = R_s$. The –3-dB bandwidth is calculated by considering that the $L_p C_p$ tank only helps shifting the centre frequency of the circuit from DC to $f_s$, keeping the same bandwidth as it is without $L_p$. If $R_{sw}$ is neglected and the Miller approximation is applied, the –3-dB passband bandwidth ($2\Delta f_{i3\,dB}$) at $V_i$ can be derived, $$2\Delta f_{i3dB} = \frac{1}{\pi R_S C_i}; C_i \approx (1 + A_{vi})C_p, \quad (5)$$

where $$A_{vi} = \frac{V_o}{V_i} = \frac{R_L(1 - g_m R_T)}{R_S(1 + g_m R_L)}.$$

Figure 2A:
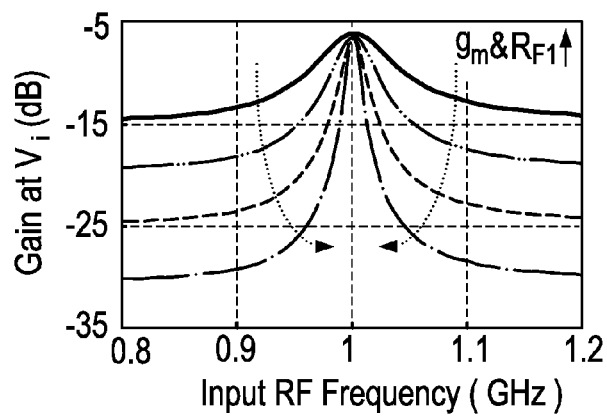
FIG. 2(a) illustrates a simulated gain at Vi in FIGS. 1(a) and (d)
Figure 2B:
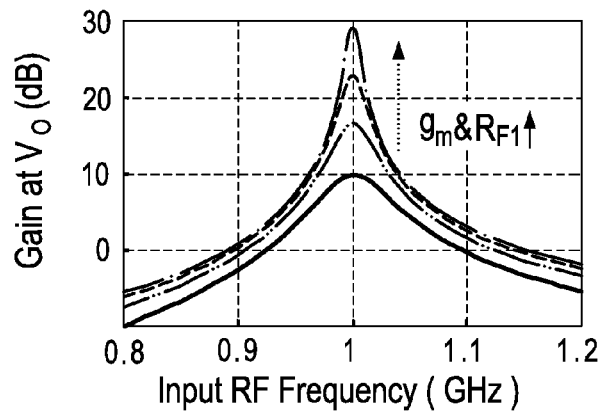
FIG. 2(b) illustrates a simulated gain at Vo in FIGS. 1(a) and (d)
Figure 2C:
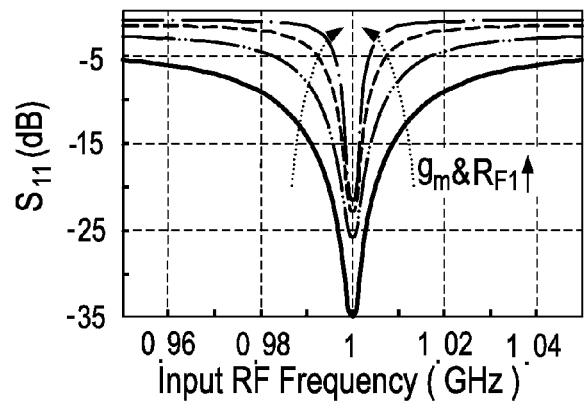
FIG. 2(c) illustrates how gm and RF1 tune the in-band gain and bandwidth while keeping the in-band S11 well below −20 dB.
Figure 3A:
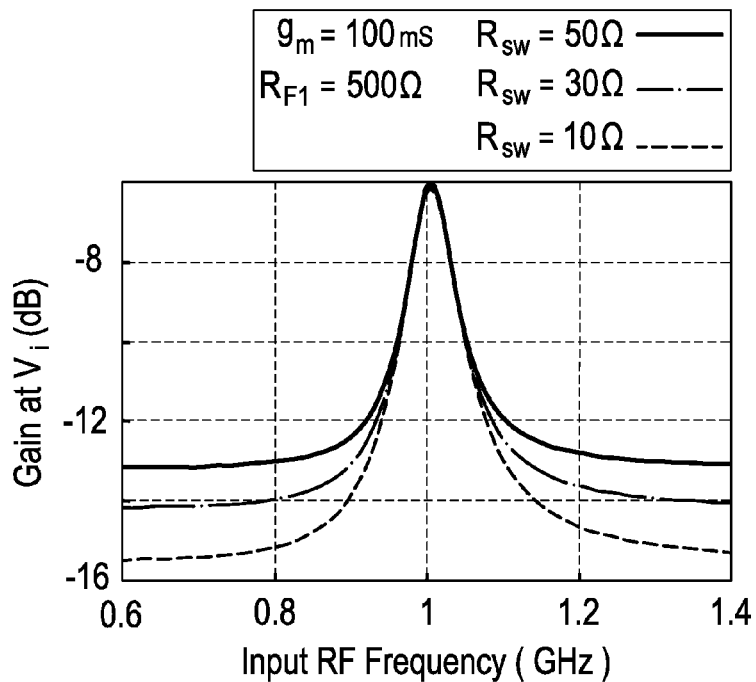
FIG. 3(a) illustrates a simulated gain at Vi in FIGS. 1(a) and (d) under Rsw=10, 30 and 50 Ω.
Figure 3B:
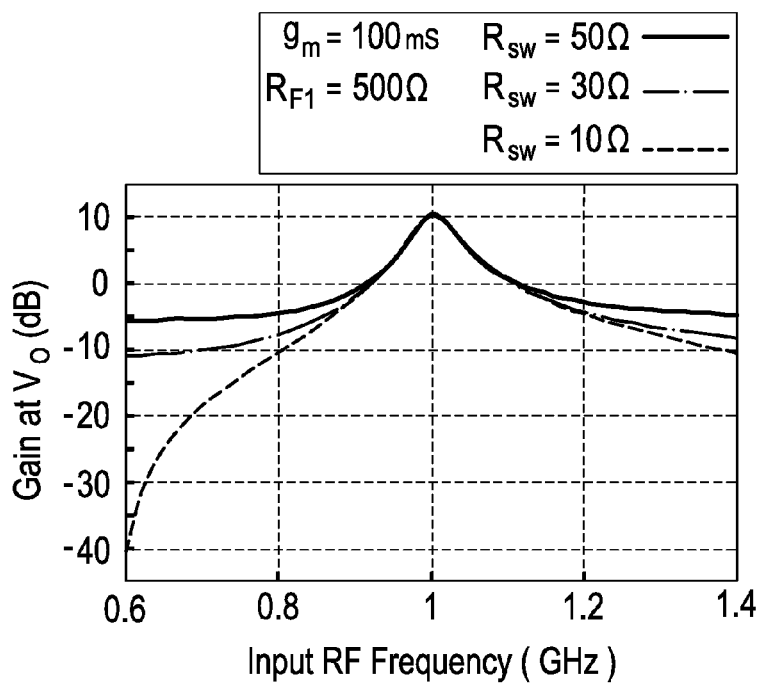
FIG. 3(b) illustrates a simulated gain at Vo in FIGS. 1(a) and (d) under Rsw=10, 30 and 50 Ω.

Obviously, $C_p$ is boosted by a gain factor $A_{vi}$, which should be 15 to 20 dB in practice. Thus, a large $A_{vi}$ can be used to improve the area efficiency, consistent with the desire of higher selectivity OB filtering, as shown in FIGS. 2(a) and (b). Passive N-path filters do not exhibit this advantageous property and the derived $C_p$ is also different. In Section II-D, an intuitive eqivalent circuit model of FIG. 1(a) will be given for a more complete comparison with the traditional architecture.

At $V_o$, the –3-dB passband bandwidth ($2\Delta f_{o3\,dB}$) can be derived next, assuming $R_{sw}=0$ for simplicity. The gain from $V_{RF}$ to $V_o$ at frequency $f_s - \Delta f_{o3\,dB}$ is given by, $$A_{vo}|_{@f_s - \Delta f_{o3dB}} = \frac{V_o}{V_{RF}} = \frac{R_L(1 - g_m Z_T)}{2R_S(1 + g_m R_L)}, \quad (6)$$

where $$Z_T = jL_{eff} // R_{F1} // R_p \text{ and} \quad (7)$$

$$L_{eff} \approx \frac{\omega_s - \Delta\omega_{o3dB}}{2\frac{\Delta\omega_{o3dB}}{\omega_s}} L_p.$$

From the definition of –3-dB passband bandwidth, $$\frac{|A_{vo|@f_s}|}{|A_{vo|@f_s - \Delta f_{o3dB}}|} = \frac{|1 - g_m R_{FP}|}{|1 - g_m Z_T|} = \sqrt{2}, \quad (8)$$

where $$A_{vo|@f_s}$$

is the voltage gain at the resonant frequency, while $R_{FP} = R_{F1}//R_F$. Substituting (6)-(7) into (8), (9) is obtained after simplification, $$L_{eff} = \frac{\sqrt{g_m^2 R_{FP}^2 - 2g_m R_{FP} - 1} \times R_{FP}}{g_m R_{FP} - 1} \approx R_{FP}. \quad (9)$$

Substituting (9) into (7), $\Delta\omega_{o3\,dB}$ becomes, $$\Delta\omega_{o3dB} = \frac{\omega_s^2}{2\frac{L_{eff}}{L_p} + \omega_s} \approx \frac{\omega_s^2}{2\frac{L_{eff}}{L_p}} = \frac{1}{2L_{eff} C_p} = \frac{1}{2R_{FP} C_p}. \quad (10)$$

Finally, $2\Delta f_{o3\,dB}$ at $V_o$ can be approximated as, $$2\Delta f_{o3dB|@V_o} \approx \frac{1}{\pi R_{FP} C_p}.$$

C. Derivation of the $R_p$-$L_p$-$C_p$ Model using the LPTV Analysis

The GB-BPF [FIG. 1(a)] can be classified as a LPTV system. This section derives the $R_p$-$L_p$-$C_p$ model of the gain-boosted N-path SC branch. The voltage on the SC branch is defined as $V_{Ci}(j\omega)$, $$V_{Ci}(j\omega) = \sum_{n=-\infty}^{\infty} H_{n,RF}(j\omega)V_{RF}(j(\omega - n\omega_s)). \quad (11)$$

Here n indicates a harmonic number of $f_s$, and $H_{n,RF}(j\omega)$ is the $n^{th}$ harmonic transfer function associated with the frequency $nf_s$. With $V_{ci}(j\omega)$, the voltages at $V_i(j\omega)$ and $V_o(j\omega)$ can be related to the input RF signal $V_{RF}(j\omega)$, $$V_i(j\omega) = \underbrace{V_{RF}(j\omega)\frac{1}{\gamma}\left(\beta\frac{R_L}{R_S} + H_{0,RF}(j\omega)\right)}_{V_{i,de}} + \quad (12)$$

$$\underbrace{\frac{1}{\gamma}\sum_{n=-\infty,n\neq 0}^{\infty} H_{n,RF}(j\omega)V_{RF}(j(\omega - n\omega_s))}_{V_{i,un}}$$

and $$V_o(j\omega) = \underbrace{\frac{R_{F1}R_L\left(1 - g_mR_{sw} + \frac{R_{sw}}{R_{F1}}\right)}{R_{F1} + R_{SW} + (R_{F1} + R_{sw})(R_s + g_mR_LR_s + R_L)}}_{V_{o,de}} \times \quad (13)$$

$$\underbrace{\left[V_{RF}(j\omega) - \frac{H_{0,RF}(j\omega)V_{RF}(j\omega)(1 + g_mR_s)}{\left(1 - g_mR_{sw} + \frac{R_{sw}}{R_{F1}}\right)}\right]}_{V_{o,de}} -$$

$$\underbrace{\frac{R_{F1}R_L(1 + g_mR_s)}{R_{F1} + R_{SW} + (R_{F1} + R_{sw})(R_s + g_mR_LR_s + R_L)}}_{V_{o,un}} \times$$

$$\underbrace{\sum_{n=-\infty,n\neq 0}^{\infty} H_{n,RF}(j\omega)V_{RF}(j(\omega - n\omega_s))}_{V_{o,un}}$$

where $$\alpha = 1 - g_mR_{sw} + \frac{R_{sw}}{R_{F1}},\ \beta = 1 + \frac{R_{sw}}{R_L} + \frac{R_{sw}}{R_{F1}}$$

and $$\gamma = \alpha + \beta\left(\frac{R_L}{R_S} + g_mR_L\right).$$

Eqs. (12) and (13) can be divided into two parts: 1) the desired frequency selectivity (i.e., $V_{i,de}$ and $V_{o,de}$) that provides filtering without frequency translation at the desired input frequency, and 2) the undesired harmonic folding components that might fall in the desired band (i.e., $V_{i,un}$ and $V_{o,un}$).

Figure 4:
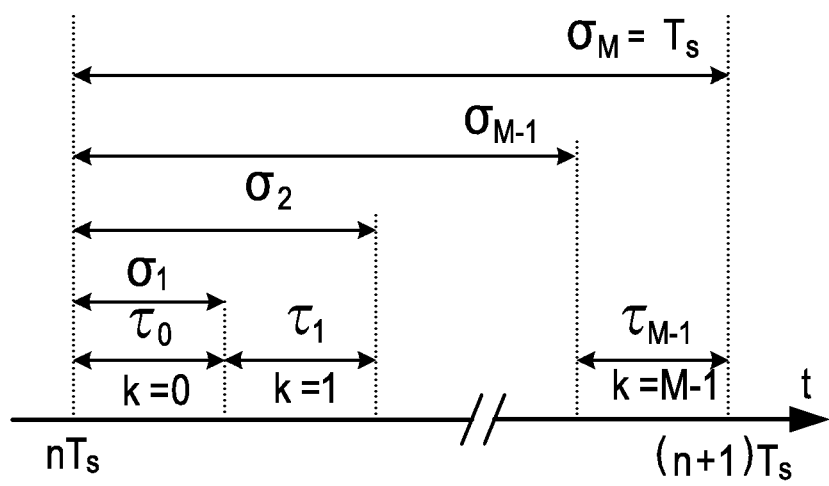
FIG. 4 illustrates time intervals for the state-space analysis.

To find $H_{n,RF}(j\omega)$, a state-space analysis is conducted. The timing diagram for the analysis is shown in FIG. 4. The timing interval $nT_s < t < nT_s + T_s$ is divided into M portions (M is the number of the states) and each portion, identified by k, can be represented as $nT_s + \sigma_k < t < nT_s + \sigma_{k+1}$, $k=0, \ldots, M-1$ and $\sigma_0 = 0$. During each interval there is no change in the state of the switches, and the network can be considered as a LTI system. During the k interval, linear analysis applied to FIG. 1(*a*) reveals that the switch on interval k has the following state-space description, $$\begin{cases} \frac{C_i d\upsilon_{Cs}(t)}{dt} + \frac{\upsilon_i(t) - \upsilon_o(t)}{R_{F1}} = \frac{\upsilon_o(t)}{R_L} + g_m\upsilon_i(t) \\ \frac{\upsilon_{RF}(t) - \upsilon_i(t)}{R_s} = \frac{\upsilon_o(t)}{R_L} + g_m\upsilon_i(t) \\ \upsilon_i(t) = \upsilon_{Ci}(t) + \upsilon_o(t) + R_{sw}\frac{C_i d\upsilon_{Cs}(t)}{dt}. \end{cases} \quad (14)$$

From (14), we obtain $$\frac{d\upsilon_{Ci}(t)}{dt} = \frac{\upsilon_{RF}(t)}{C_iR_1} - \frac{\upsilon_{Ci}(t)}{C_iR_2}, \quad (15)$$

where $$R_1 = \frac{1 + \frac{R_{sw}}{R_{F1}} + \frac{R_{sw} + R_S}{R_L} + \frac{R_{sw}R_S}{R_{F1}R_L} + g_mR_S + \frac{g_mR_{sw}R_S}{R_{F1}}}{\frac{1}{R_L} + g_m}$$

$$R_2 = \frac{1 + \frac{R_{sw}}{R_{F1}} + \frac{R_{sw} + R_S}{R_L} + \frac{R_{sw}R_S}{R_{F1}R_L} + g_mR_S + \frac{g_mR_{sw}R_S}{R_{F1}}}{\frac{1}{R_{F1}} + \frac{1}{R_L} + \frac{R_S}{R_{F1}R_L} + \frac{g_mR_S}{R_{F1}}}.$$

By applying the state-space analysis for the circuit in FIG. 1(*a*), the harmonic transfer function can be derived as, $$H_{n,RF}(j\omega) = \sum_{m=0}^{N-1} e^{-jn\omega_s\sigma_m} H_{n,m}(j\omega) \quad (16)$$

$$H_{n,m}(j\omega) =$$

$$\frac{\omega_{rc,B}}{\omega_{rc,A} + j\omega} \times \frac{1 - e^{-jn\omega_s\tau_m}}{j2\pi n} + \frac{1 - e^{j(\omega - n\omega_s)(T_S - \tau_m) - jn\omega_s\tau_m}}{\omega_{rc,A} + j\omega}G(j\omega)f_s$$

where $$G(j\omega) = \frac{e^{j(\omega - n\omega_s)\tau_m} - e^{-\omega_{rc,A}\tau_m}}{e^{j2\pi(\omega - n\omega_s)/\omega_s} - e^{-\omega_{rc,A}\tau_m}} \times \frac{1}{\frac{\omega_{rc,A}}{\omega_{rc,B}} + \frac{j(\omega - n\omega_s)}{\omega_{rc,B}}},$$

$\omega_{rc,A} = 1/R_2C_i$ and $\omega_{rc,B} = 1/R_1C_i$. The above $H_{n,RF}(j\omega)$ is undefined for $n=0$, and, for this value, (16) will be defined by the limit when n tends to zero, implying that, $$H_{0,RF}(j\omega) = \frac{\omega_{rc,B}}{\omega_{rc,A} + j\omega} + \frac{1 - e^{j\omega(T_S - \tau_m)}}{\omega_{rc,A} + j\omega}G(j\omega)f_sN \quad (17)$$

where $$G(j\omega) = \frac{e^{j\omega\tau_m} - e^{-\omega_{rc,A}\tau_m}}{e^{j2\pi\omega/\omega_s} - e^{-\omega_{rc,A}\tau_m}} \times \frac{1}{\frac{\omega_{rc,A}}{\omega_{rc,B}} + \frac{j\omega}{\omega_{rc,B}}}.$$

To find $R_p$, $H_{0,RF}(j\omega)$ is calculated at $\omega = nf_s$ with $\omega_s \gg \omega_{rc,A}$, $\omega_{rc,B}$, yielding, $$H_{0,RF}(jn\omega_s) = \frac{2N(1 - \cos 2\pi nD)}{4D(n\pi)^2} \times \frac{\omega_{rc,B}}{\omega_{rc,A}}, \quad (18)$$

where $D = 1/N$ is the duty cycle of the LO. Furthermore, (18) is similar to (15), except for the added term $\omega_{rc,B}/\omega_{rc,A}$.

If $n=1$, $N=4$ and $D=0.25$, for a 25%-duty-cycle 4-path LO, (18) becomes, $$H_{0,RF}(j\omega_s) = \frac{8}{\pi^2} \times \frac{R_2}{R_1}. \quad (19)$$

Assuming that $L_p$ is resonant with $C_p$ at $\omega_s$, it implies, $$\begin{cases} \dfrac{V_i - H_{0,RF}(j\omega_s)V_{RF} - V_o}{R_{sw}} = \dfrac{H_{0,RF}(j\omega_s)V_{RF}}{R_p} \\ \dfrac{V_i - H_{0,RF}(j\omega_s)V_{RF} - V_o}{R_{sw}} + \dfrac{V_i - V_o}{R_{F1}} = g_m V_i + \dfrac{V_o}{R_L} \\ \dfrac{V_{RF} - V_i}{R_s} = g_m V_i + \dfrac{V_o}{R_L}. \end{cases} \quad (20)$$

Solving (20), it leads to the desired $R_p$, $$R_p = \frac{\eta H_{0,RF} R_{sw}}{\left(\frac{R_L R_{FL}}{R_s} + \frac{H_{0,RF}}{R_{sw}}\right)\left(1 + \frac{R_L}{R_s} + g_m R_L\right) - \left(H_{0,RF} + \frac{R_L}{R_s}\right)\eta},$$

where $$R_{FL} = \frac{1}{R_L} + \frac{1}{R_{F1}} + \frac{1}{R_{sw}}$$

$$\eta = \frac{1}{R_{sw}} + \frac{1}{R_{F1}} - g_m + \frac{R_L R_{FL}}{R_s} + g_m R_L R_{FL}.$$

Finally, placing the pole around $\omega_s$ in (17), with a value equal to the poles of the transfer function from $V_{RF}$ to $V_{Cp}$ of FIG. 1(d), it will lead to the expressions of $C_p$ and $L_p$, $$C_p = \frac{\gamma_1 + R_p}{2D\omega_{rc,A}\gamma_1 R_p} \quad (21)$$

$$L_p = \frac{\gamma_1 R_p}{D\omega_{rc,A}(\gamma_1 + R_p) - (D^2\omega_{rc,A}^2 - \omega_s^2)\gamma_1 R_p C_p} \quad (22)$$

where $$\alpha_1 = \frac{1}{R_{sw}} + \frac{1}{R_{F1}} - g_m, \quad \gamma_1 = -\frac{\alpha_1 \beta_1 R_{sw}^2}{\beta_1 - 1 - \alpha_1 \beta_1 R_{sw}},$$

$$\beta_1 = \frac{\frac{1}{R_L} + \frac{1}{R_{F1}} + \frac{1}{R_{sw}} + \frac{\alpha_1 R_s}{R_L(1 + g_m R_s)}}{\frac{1}{R_L} + g_m}.$$

From (21)-(22), $C_p$ is irrelevant to the LO frequency $\omega_s$, while $L_p$ is tunable with $\omega_s$. Moreover, the term $D\omega_{rc,A}(\gamma_1 + R_p) - (D^2\omega_{rc,A}^2 - \omega_s^2)\gamma_1 R_p C_p$ in the denominator of (22) renders that the $L_p//C_p$ resonant frequency shifts slightly away from the center frequency $\omega_s$. For $$\omega_s \gg \omega_{rc,A}, L_p \approx \frac{R_p}{\omega_s^2 C_p}$$

is obtained and will resonate out with $C_p$ at $\omega_s$. Then, the frequency responses can be plotted using the derived expressions, and compared with the simulated curves of FIGS. 5(a) and (b); showing a good fitting around $\omega_s$, and confirming the previous analysis. The small discrepancy arises from the approximation that $L_p$ will resonate out with $C_p$ at $\omega_s$ when deriving $R_p$ in (20). This effect is smaller at $V_i$ than at $V_o$, due to the gain of the GB-BPF.

II. Harmonic Selectivity, Harmonic Folding and Noise

A. Harmonic Selectivity and Harmonic Folding

Using the harmonic selectivity function $H_{0,RF}(j\omega)$ from (18), the relative harmonic selectivity is calculated by combining (13) and (18) for $V_i$ and $V_o$. For example, when $N=4$, $$\frac{V_0(\omega_s)}{V_0(n\omega_s)} = \frac{1 - \frac{8}{\pi^2} \times \frac{R_2}{R_1} \times \text{Constant}}{1 - \frac{8}{(n\pi)^2} \times \frac{R_2}{R_1} \times \text{Constant}} \approx n^2,$$

which matches with the 4-path passive mixer. Likewise, using (12) and (18), the harmonic selectivity at $V_i$ is derived as, $$\frac{V_1(\omega_s)}{V_1(n\omega_s)} \approx \frac{R_L + \frac{8}{\pi^2} \times R_{F1}}{R_L + \frac{8}{(n\pi)^2} \times R_{F1}} < n^2.$$

Obviously, the harmonic selectivity at $V_i$ is smaller than that at $V_o$ with the design parameters used here.

Figure 6A:
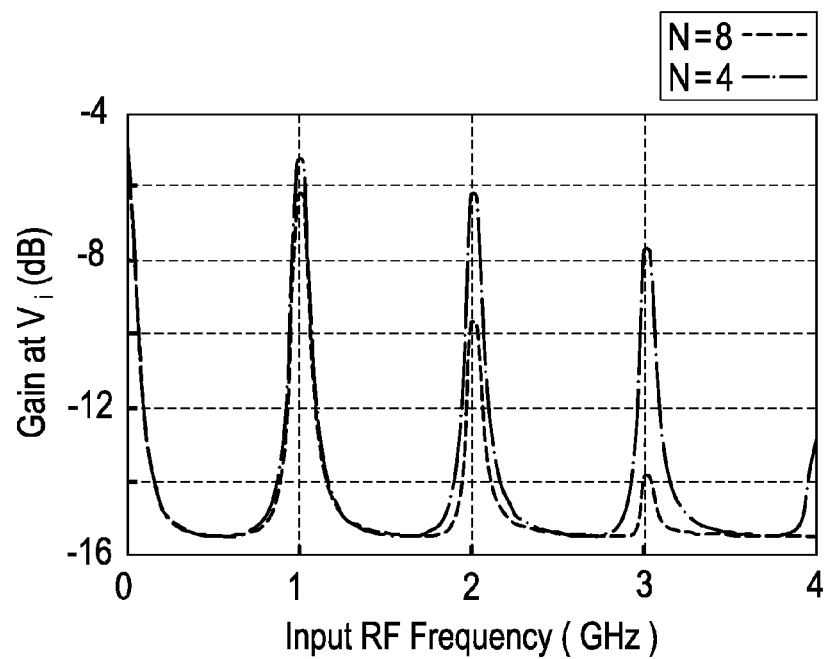
FIG. 6(a) illustrates simulated responses under N=4 and N=8: the gain at Vi, wherein the responses are consistent with eq. (17)
Figure 6B:
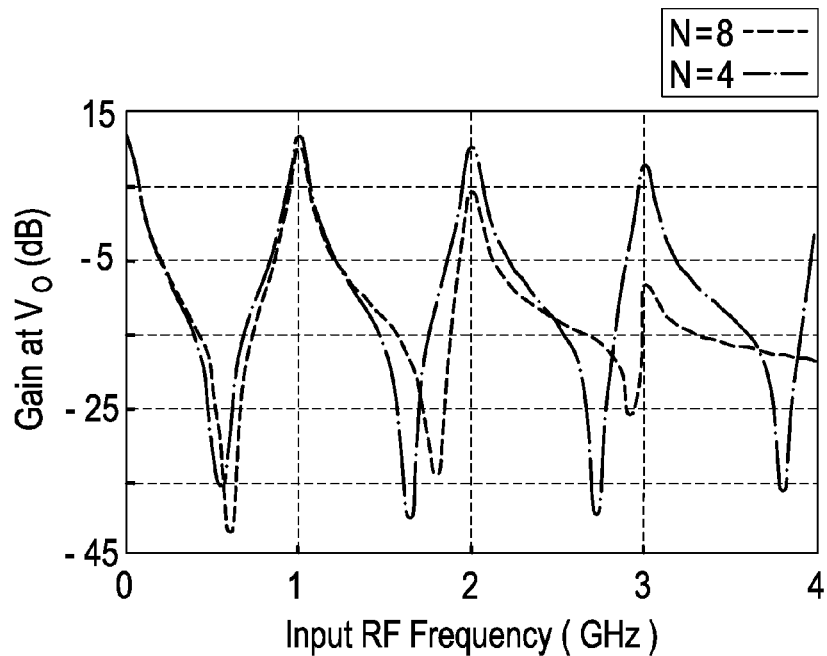
FIG. 6(b) illustrates simulated responses under N=4 and N=8: the gain at Vo, wherein the responses are consistent with eq. (17)

The above analysis has ignored the even-order harmonic selectivity which should be considered in single-ended designs. The harmonic selectivity for $N=4$ and $N=8$ with a fixed total value of capacitance and $g_m R_{sw} = 1$ are shown in FIGS. 6(a) and 6(b), respectively. For $N=4$, $V_o(3\omega_s)/V_o(\omega_s) = 18.67$ dB and $V_i(3\omega_s)/V_i(\omega_s) = 7.6$ dB, close to the above analysis. Moreover, the relative harmonic selectivity can be decreased by raising N. Furthermore, as derived in (4), $g_m R_{sw} = 1$ results in a stronger OB attenuation at far out frequencies that are irrelevant to N. Finally, the bandwidth at $V_i$ and $V_o$ can be kept constant if the total amount of capacitors is fixed under different N. This will be quite explicit when the equivalent circuit will be presented later in Section II-C.

Figure 7A:
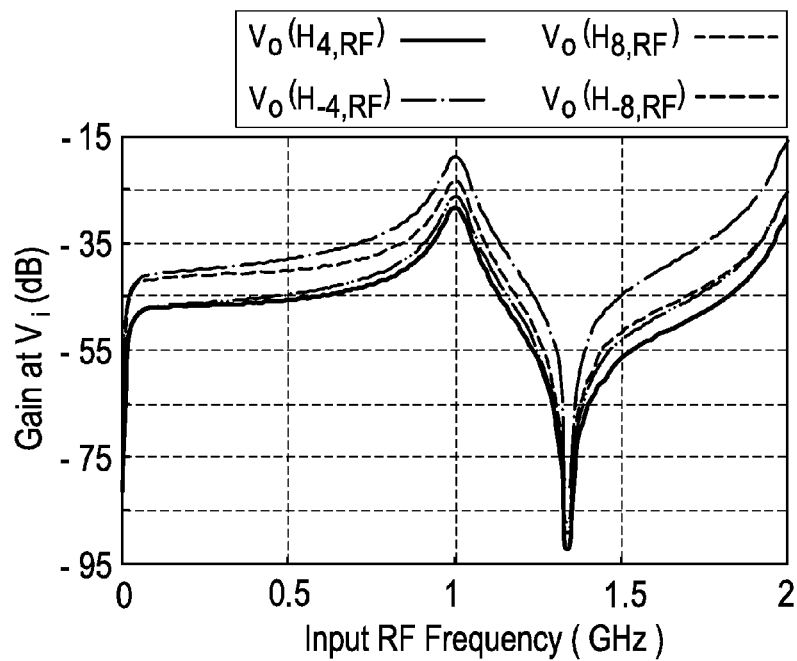
FIG. 7(a) illustrates a simulated harmonic folding effects under N=4: the gain at Vi, wherein the responses are consistent with eq. (16)
Figure 7B:
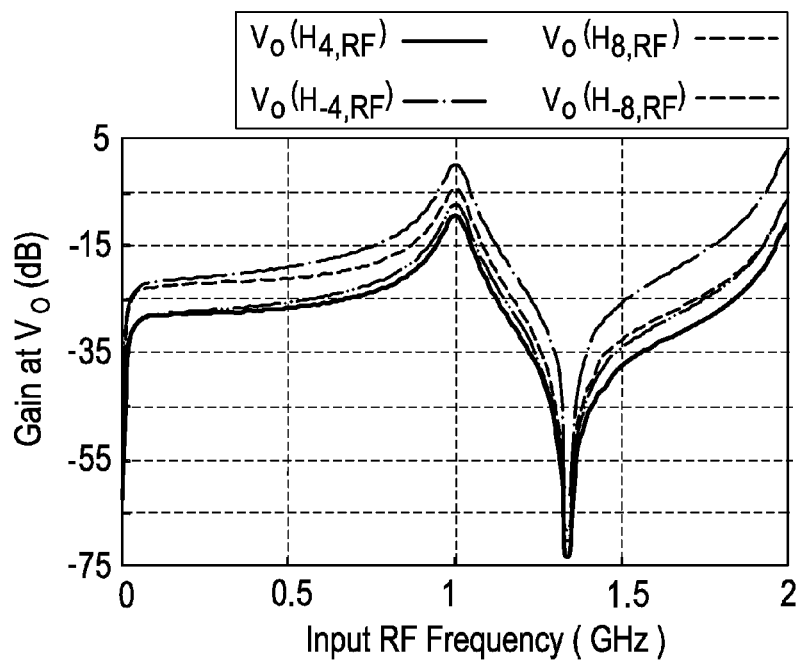
FIG. 7(b) illustrates a simulated harmonic folding effects under N=4: the gain at Vo, wherein the responses are consistent with eq. (16)
Figure 8A:
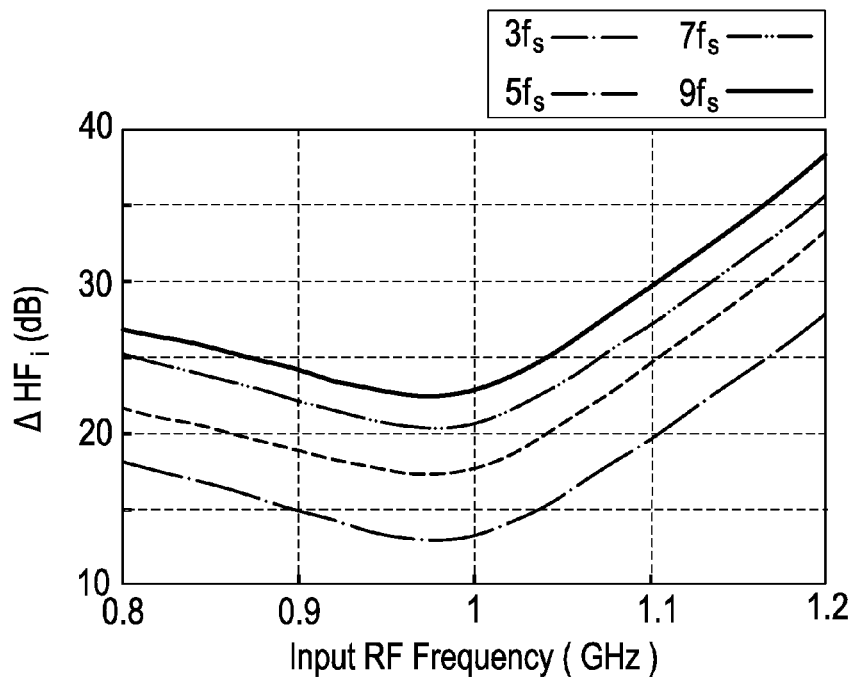
FIG. 8(a) illustrates a simulated harmonic folding gain (normalized) under N=4 at Vi.
Figure 8B:
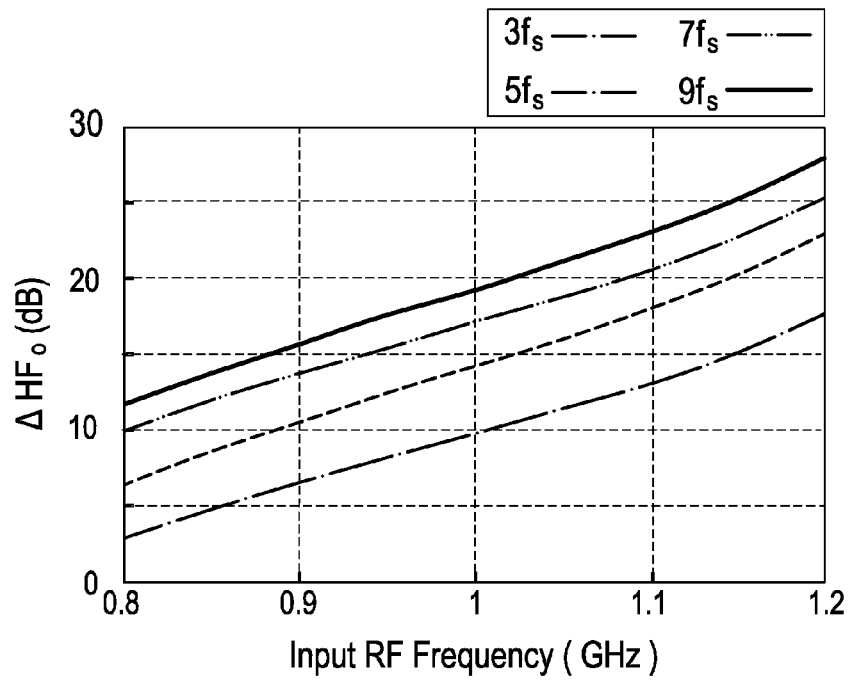
FIG. 8(b) illustrates a simulated harmonic folding gain (normalized) under N=4 at Vo.

For $N=4$, the simulated harmonic folding at $V_i$ and $V_o$ are shown in FIGS. 7(a) and (b), respectively, which obey well (12), (13) and (16) (not plotted). Similar to the N-path passive mixers, the input frequencies around $k(N\pm 1)f_s$ will be folded onto the desired frequency around $f_s$. The strongest folding term is from $3f_s$ when k=1, and will become smaller if k (integer number) is increased. The relative harmonic folding $\Delta HF_i = 20 \log[V_{i,de}(j\omega)] - 20 \log[V_{i,un}(j\omega)]$ and $\Delta HF_o = 20 \log[V_{o,de}(j\omega)] - 20 \log[V_{o,un}(j\omega)]$ are plotted in FIGS. 8(*a*) and (*b*), respectively. The relative harmonic folding is smaller at $V_i$ than at $V_o$, which is preferable because harmonic folding at $V_i$ cannot be filtered.

B. Noise

Figure 9:
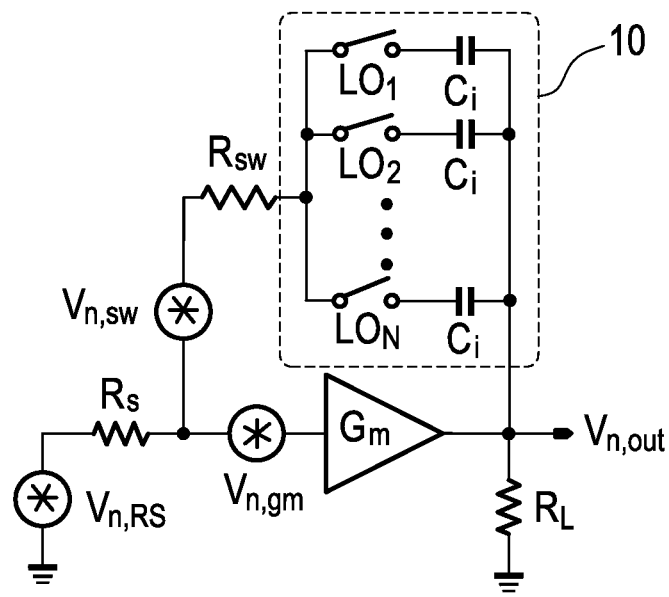
FIG. 9 illustrates an equivalent noise model of the GB-BPF.
Figure 10A:
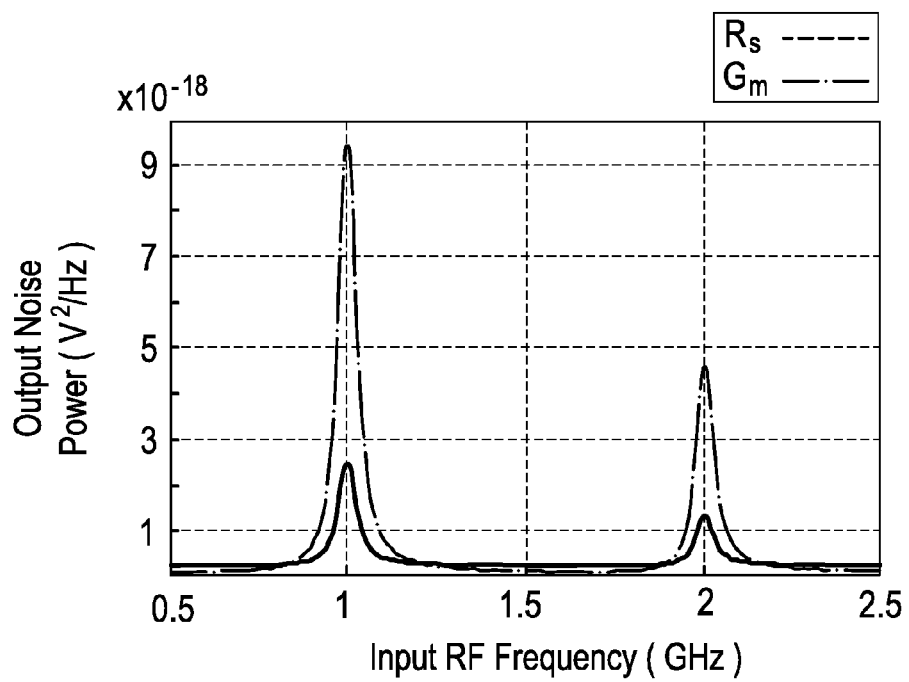
FIG. 10(a) illustrates a simulated output noise power at $V_o$ due to $R_S$ and $G_m$, wherein the results are consistent with eqs. (23), (25) and (27), and wherein the parameters are Rsw=30 Ω, RL=80 Ω, RS=50 Ω, Ci=5 pF, gm=100 mS, RF1=500 Ω, fs=1 GHz, N=4, $\overline{V_{n,sw}^2}$=4kTRsw=4.968×10-19 (V2/Hz), $\overline{V_{n,Rs}^2}$=4kTRs=8.28×10-19 (V2/Hz) and $\overline{V_{n,gm}^2}$=4kT/gm=1.656×10-19 (V2/Hz)
Figure 10B:
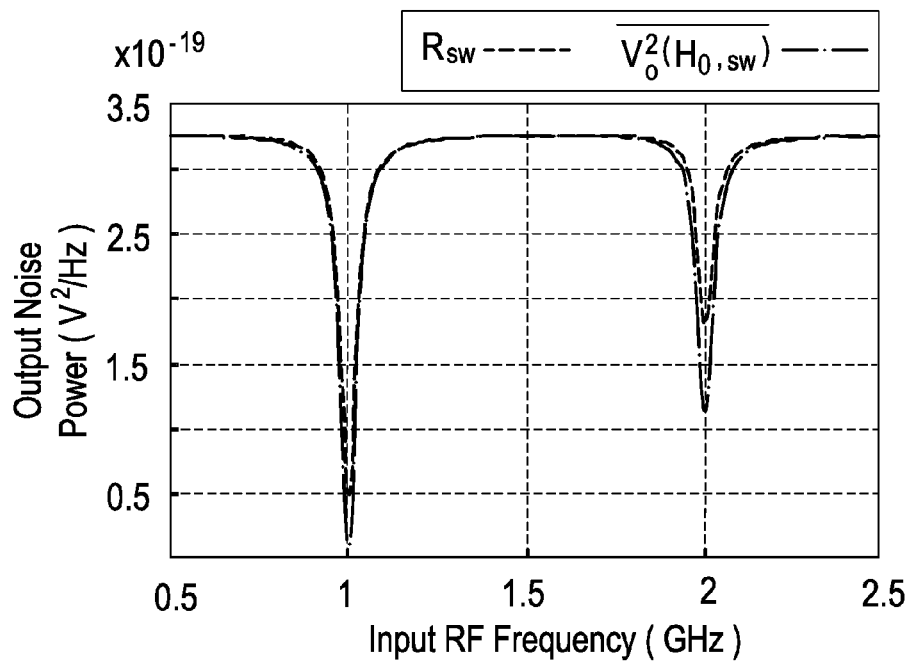
FIG. 10(b) illustrates a simulated output noise power at Vo due to RSW, wherein the results are consistent with eqs. (23), (25) and (27), wherein the output noise power $\overline{V_o^2(H_0(j\omega))}$ with notch shape of Rsw is plotted using eq. (25) Part A and wherein the parameters are Rsw=30 Ω, RL=80 Ω, RS=50 Ω, Ci=5 pF, gm=100 mS, RF1=500 Ω, fs=1 GHz, N=4, $\overline{V_{n,sw}^2}$=4kTRsw=4.968×10-19 (V2/Hz), $\overline{V_{n,Rs}^2}$=4kTRs=8.28×10-19 (V2/Hz) and $\overline{V_{n,gm}^2}$=4kT/gm=1.656×10-19 (V2/Hz)
Figure 10C:
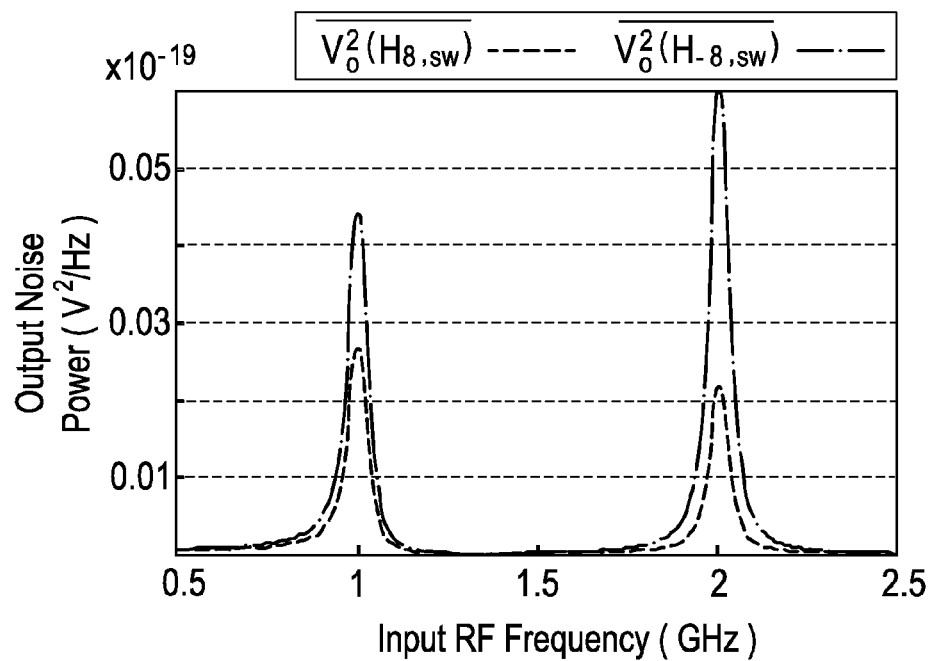
FIGS. 10(c) and (d) illustrates the harmonic folding parts $\overline{V_o^2(H_{\pm4}(j\omega))}$ and $\overline{V_o^2(H_{\pm8}(j\omega))}$ using eq. (25) Part B, wherein the parameters are Rsw=30 Ω, RL=80 Ω, RS=50 Ω, Ci=5 pF, gm=100 mS, RF1=500 Ω, fs=1 GHz, N=4, $\overline{V_{n,sw}^2}$=4kTRsw=4.968×10-19 (V2/Hz), $\overline{V_{n,Rs}^2}$=4kTRs=8.28×10-19 (V2/Hz) and $\overline{V_{n,gm}^2}$=4kT/gm=1.656×10-19 (V2/Hz)
Figure 10D:
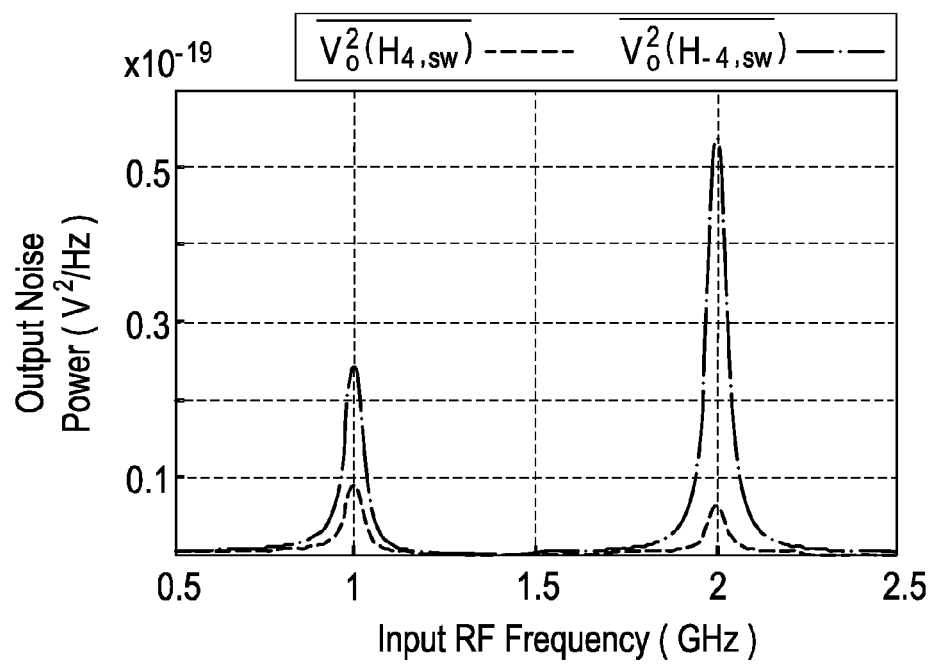

The output noises under consideration are the thermal noises from $R_s$, $R_{sw}$ and $G_m$. Since the power spectral density (PSD) of these noise sources are wideband, harmonic folding noise should be considered. The model to derive those noise transfer functions is shown in FIG. 9.

To calculate the noise from $R_s$ to $V_o$ (13) needs to be revised in order to obtain, $$\overline{V_{n,out,RS}^2} = \left| \underbrace{\frac{R_{F1}R_L\left(1 - g_m R_{sw} + \frac{R_{sw}}{R_{F1}}\right)}{R_{F1}R_{SW} + (R_{F1} + R_{sw})(R_s + g_m R_L R_s + R_L)} }_{Part\ A} \right|^2 \times \quad (23)$$

$$\underbrace{|V_{n,RS} j\omega^2| \times \left| 1 - \frac{H_{0,RP}(j\omega)(1 + g_m R_s)}{\left(1 - g_m R_{sw} + \frac{R_{sw}}{R_{F1}}\right)} \right|^2 }_{Part\ A} +$$

$$\underbrace{\left| \frac{R_{F1}R_L(1 + g_m R_s)}{R_{F1}R_{SW} + (R_{F1} + R_{sw})(R_s + g_m R_L R_s + R_L)} \right|^2 }_{Part\ B} \times$$

$$\underbrace{\sum_{n=-\infty,n\neq 0}^{\infty} |H_{n,RF}(j\omega)V_{n,RS}(j(\omega - n\omega_s))|^2 }_{Part\ B}.$$

In (23), Part A is the output noise PSD due to $R_s$ without frequency translation, while Part B is due to harmonic folding. Similarly, linear analysis of $v_{n,sw}(t)$ results in the state-space description, $$\frac{dv_{ci}(t)}{dt} = \frac{v_{n,sw}(t)}{C_i R_1} - \frac{v_{ci}(t)}{C_i R_2} \quad (24)$$

where $$R_1 = \frac{-(1+\alpha_2 R_{sw})}{\alpha_2}, R_2 = -R_1,$$

$$\alpha_2 = \frac{\left(\frac{1}{R_{F1}} + \frac{1}{R_S} + \frac{R_L}{R_{F1}R_S} + \frac{g_m R_L}{R_{F1}}\right)}{\left(1 + g_m R_L + \frac{R_L}{R_S}\right)}.$$

with a minus sign in $R_1$. Combining (24) with (16) and (17), the output noise PSD transfer function of $R_{sw}$ from $V_{n,sw}$ to $V_{ci}$ [i.e., $H_{0,sw}(j\omega)$] and its harmonic folding [i.e., $H_{n,sw}(j\omega)$] can be derived, leading to the final output noise of PSD to $V_o$ expressed as, $$\overline{V_{n,out,sw}^2} = \underbrace{\frac{|V_{n,sw}(j\omega)|^2 |(1 + H_{0,sw})|^2}{\left|\left(-\frac{R_S}{\gamma_2 R_L} - 1 - \frac{R_{sw}}{\gamma_2 R_L} - \frac{R_{sw}}{R_{F1}} - \frac{R_{sw} R_S}{\gamma_2 R_L R_{F1}}\right)\right|^2}}_{Part\ A} + \quad (25)$$

$$\underbrace{\sum_{n=-\infty,n\neq 0}^{\infty} \left| \frac{H_{n,sw}(j\omega) V_{n,sw}(j\omega - jn\omega_s)}{-\frac{R_S}{\gamma_2 R_L} - 1 - \frac{R_{sw}}{\gamma_2 R_L} - \frac{R_{sw}}{R_{F1}} - \frac{R_{sw} R_S}{\gamma_2 R_L R_{F1}}} \right|^2}_{Part\ B}$$

where $y_2 = 1 + g_m R_S$.

In (25), Part A is the noise transfer function without harmonic folding, while Part B corresponds to the harmonic folding. Similarly, linear analysis of $v_{n,gm}(t)$ has the state-space description $$\frac{dv_{ci}(t)}{dt} = \frac{v_{n,sw}(t)}{C_i R_1} - \frac{v_{ci}(t)}{C_i R_2} \quad (26)$$

where $$R_1 = \frac{\alpha_3 + \frac{R_s}{R_L}}{\alpha_3 \beta_3 + \beta_3 \frac{R_s}{R_L} - \gamma_3 g_m R_s}, R_2 = \frac{\alpha_3 + \frac{R_s}{R_L}}{\alpha_3 \gamma_3}$$

$$\alpha_3 = 1 + g_m R_s, \beta_3 = \frac{g_m}{\alpha_3}\left(\frac{R_s}{R_{F1}} + 1\right)$$

$$\gamma_3 = \frac{1}{R_L} + \frac{1}{R_{F1}} - \frac{g_m R_s}{\alpha_3 R_L} + \frac{R_s}{\alpha_3 R_L R_{F1}}.$$

From (26) together with (16) and (17), the output noise PSD transfer function of $G_m$ stage from $V_{n,gm}$ to $V_{ci}$ [i.e., $H_{0,gm}(j\omega)$] and its harmonic folding [i.e., $H_{n,gm}(j\omega)$] can be derived. Finally, the output noise PSD to $V_o$ is, $$\overline{V_{n,out,gm}^2} = \underbrace{\frac{|V_{n,gm}(j\omega)|^2 \left|g_m + H_{0,gm} g_m + \frac{H_{0,gm}}{R_S}\right|^2}{\left|\frac{1}{R_S} + \frac{1}{R_L} + g_m\right|^2}}_{Part\ A} + \quad (27)$$

$$\underbrace{\sum_{n=-\infty,n\neq 0}^{\infty} \left|g_m \frac{H_{n,gm}(j\omega) V_{n,gm}(j\omega - jn\omega_s)}{\frac{1}{R_s} + \frac{1}{R_L} + g_m}\right|}_{Part\ B}.$$

The simulated output noises at $V_o$ due to $v_{n,RS}(t)$ and $v_{n,gm}(t)$ are shown in FIG. 10(*a*), whereas FIGS. 10(*b*) and (*c*) show the output noise due to $v_{n,sw}(t)$ and its key harmonic folding terms, respectively. Similar to the signal transfer function, the output noises from $R_S$ and $G_m$ are alike a comb, and can be considered as narrowband around $n\omega_s$. Unlike the traditional wideband LNAs that have wideband output noise, here the output noise around the LO harmonics is much less than that at the LO $1^{st}$ harmonic. Thus, a wideband passive mixer follows the GB-BPF for downconversion, with the noise due to harmonic folding being much relaxed. Besides, the noise transfer function of $R_{sw}$ is a notch function, while its harmonic folding terms are bandpass with much smaller amplitude. This is also true for the conventional N-path passive mixer with a difference method. Around $n\omega_s$ where the in-band signal exists, the main contribution to its noise is the folding from higher harmonics, which is much less than the OB noise. The noise from $R_{sw}$ is thus greatly suppressed, and a larger $R_{sw}$ is allowed to relax the LO power. In other words, by re-sizing $g_m$, smaller switches can be used for the SC branch while keeping a high OB selectivity filtering profile as analyzed in the prior art.

C. Intuitive Equivalent Circuit Model

Figure 5A:
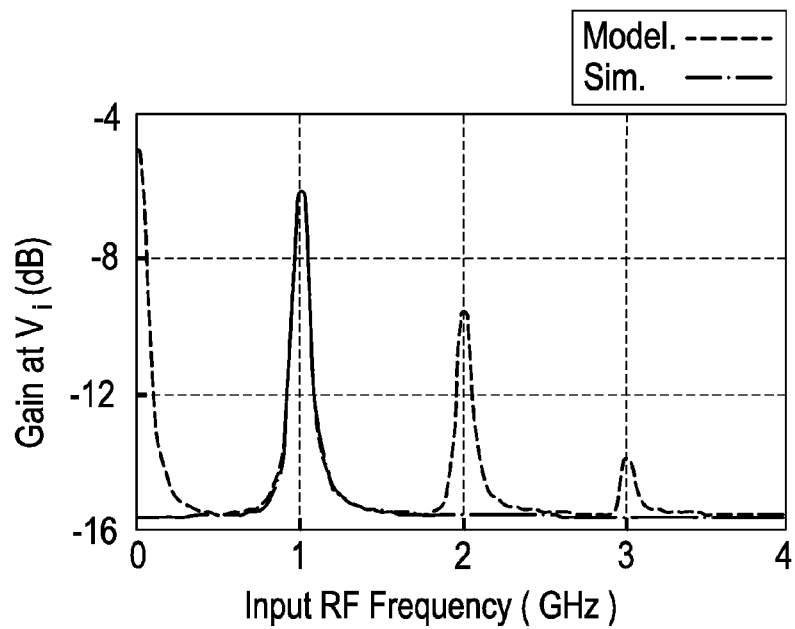
FIG. 5(a) illustrates a comparison between the simulation and the analytic derived model using equations (21)-(22): the gain at Vi, wherein the parameters are Rsw=10 Ω, RL=80 ΩQ, RS=50 ≠, Ci=5 pF, gm=100 mS, RF1=500 Ω, fs=1 GHz and N=4.
Figure 5B:
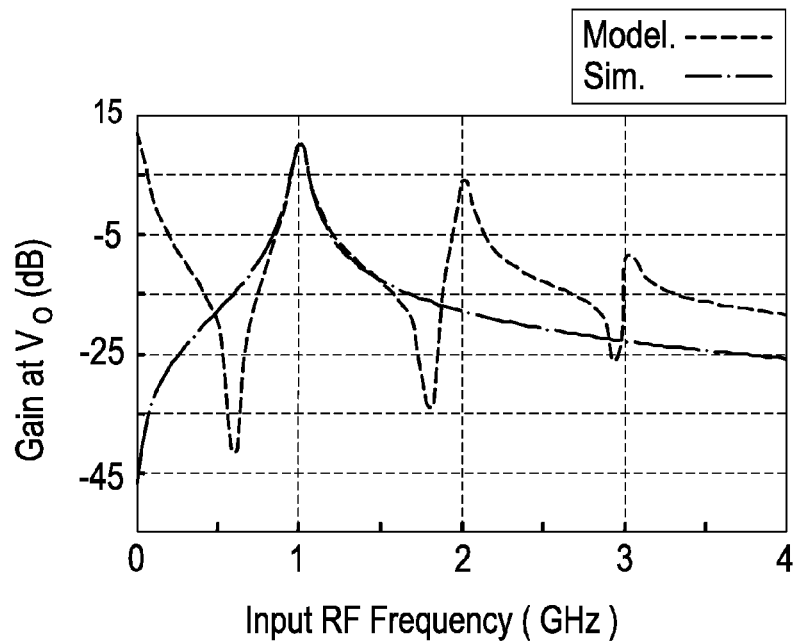
FIG. 5(b) illustrates a comparison between the simulation and the analytic derived model using eqs. (21)-(22): the gain at Vo, wherein the parameters are Rsw=10 Ω, RL=80 Ω, RS=50 Ω, Ci=5 pF, gm=100 mS, RF1=500 Ω, fs=1 GHz and N=4.
Figure 11A:
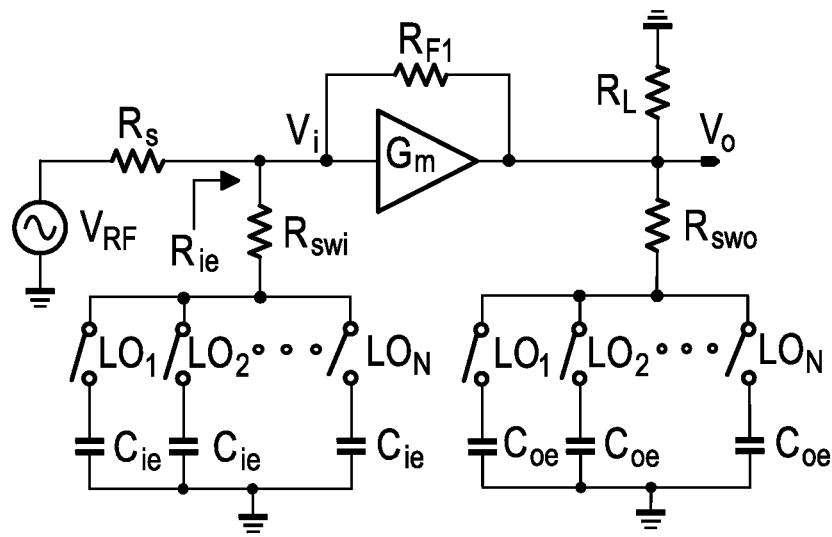
FIG. 11(a) illustrates an intuitive equivalent circuit of the GB-BPF: a typical $G_m$.
Figure 11B:
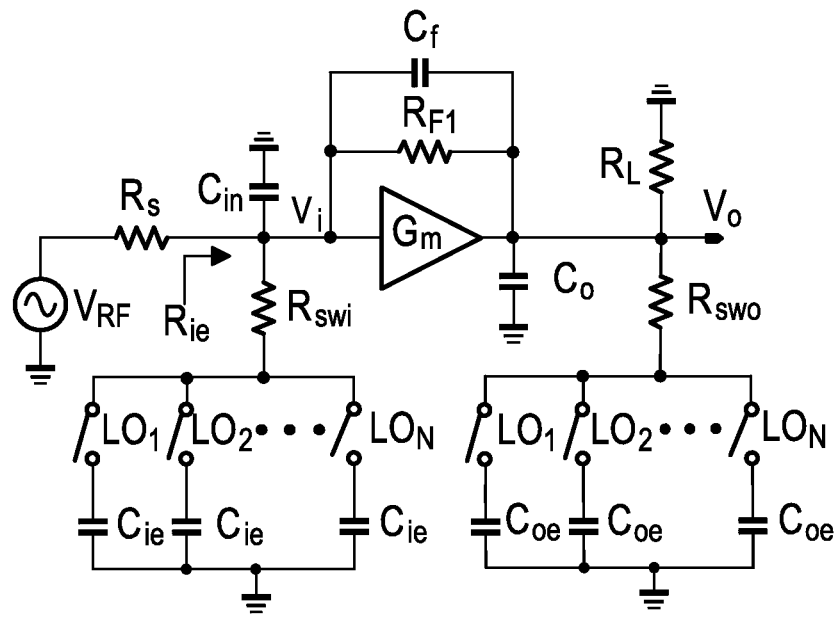
FIG. 11(b) illustrates an intuitive equivalent circuit of the GB-BPF: a non-ideal Gm with parasitic capacitances Cin, Co and Cf.

As shown in FIGS. 5(a) and (b), the filtering behavior at both $V_i$ and $V_o$ are similar to that of a single-ended passive mixer, which motivates the re-modeling of the circuit in FIG. 1(a) with two sets of single-ended passive mixers: one at $V_i$ and one at $V_o$, as shown in FIG. 11(a). With the proposed intuitive equivalent circuit, it is convenient to include the parasitic capacitances at both $V_i$ and $V_o$ by using a known theory as shown in FIG. 11(b). The non-idealities due to LO phase/duty cycle mismatch can be analyzed, while the variation of $g_m$ to the in-band gain is similar to the condition of a simple inverter since the two sets of passive mixer are of high impedance at the clock frequency. Inside, we re-model the switch's on-resistance as $R_{swi}$ at $V_i$ with capacitance $C_{ie}$, and $R_{swo}$ at $V_o$ with capacitance $C_{oe}$.

$$\begin{cases} R_{swi} = \dfrac{(R_{sw}//R_{F1})+R_L}{1+g_mR_L} \approx \dfrac{R_{sw}+R_L}{1+g_mR_L} \\ C_{ie} = \left|\dfrac{(1-g_mR_{F1})R_L}{R_L+R_{F1}}\right| \times C_i \\ R_{swo} = \dfrac{(R_{sw}//R_{F1})+R_s}{1+g_mR_s} \\ C_{oe} = C_1 \end{cases} \quad (28)$$

$R_{swi}$ described in (28) equals to (2). Thus, for far-out blockers, $R_{swi}/R_{ie}$ is smaller than $R_i$, which results in better ultimate rejection [FIG. 11(a)]. The value of $C_{ie}$ is obvious, it equals the gain of the circuit multiplied by $C_i$, but without the SC branch in the feedback. It can be designated as the open-SC gain, and it can be enlarged to save area for a specific −3-dB bandwidth. As an example, with $R_L$=80 Ω, $R_{sw}$=30 Ω, $R_s$=50 Ω, $C_i$=5 pF, $g_m$=100 mS and $R_{F1}$=500 Ω, $C_{ie}$ is calculated to be 33.79 pF, which is ~6× smaller than $C_i$ in the traditional design, thus the area saving in $C_i$ is significant. For $R_{swo}$, it equals the output resistance with $R_{sw}$ in the feedback. This is an approximated model without considering the loading from $R_{swi}$ to $R_{swo}$.

Figure 12A:
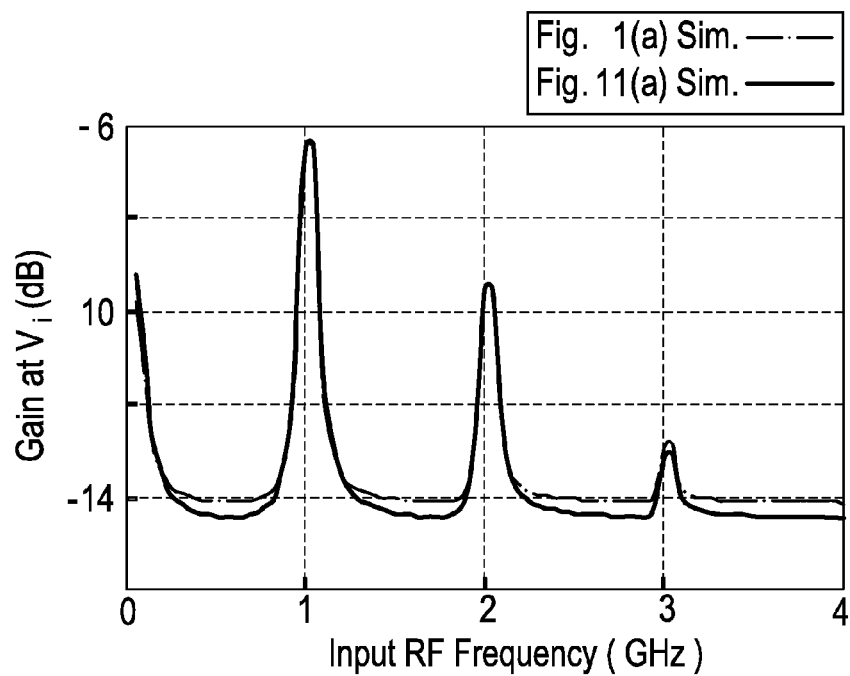
FIG. 12(a) illustrates a simulation comparison of FIGS. 1(a) and 11(a): the gain at Vi, wherein the parameters are Rsw=30 Ω, RL=80 Ω, RS=50 Ω, Ci=5 pF, gm=100 mS, RF1=500 Ω, fLo=1 GHz and N=4.
Figure 12B:
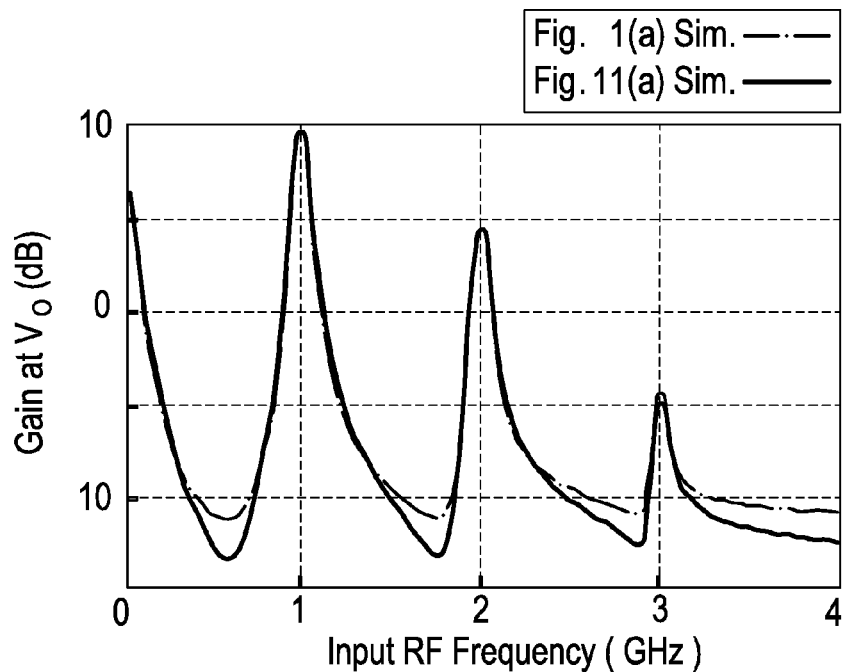
FIG. 12(b) illustrates a simulation comparison of FIGS. 1(a) and 11(a): the gain at Vo, wherein the parameters are Rsw=30 Ω, RL=80 Ω, RS=50 Ω, Ci=5 pF, gm=100 mS, RF1=500 Ω, fLo=1 GHz and N=4.
Figure 13A:
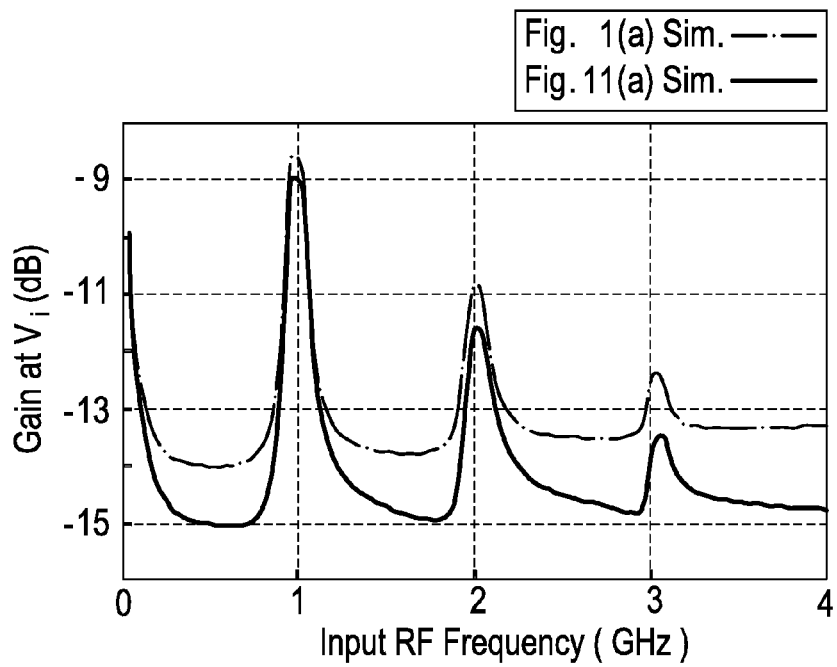
FIG. 13(a) illustrates a simulation comparison of FIGS. 1(a) and 11(a): the gain at Vi, wherein the parameters are the same as FIG. 12, with the additional Cin=1 pF, Co=1 pF and Cf=500 fF.
Figure 13B:
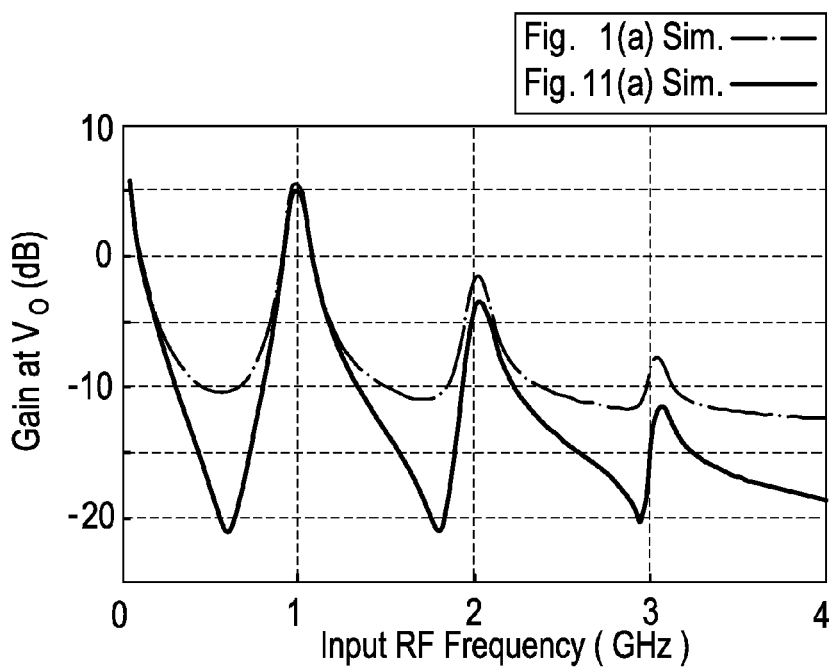
FIG. 13(b) illustrates a simulation comparison of FIGS. 1(a) and 11(a): the gain at Vo, wherein the parameters are the same as FIG. 12, with the additional Cin=1 pF, Co=1 pF and Cf=500 fF.

To verify it, the frequency responses of FIG. 1(a) and FIG. 11(a) are plotted together in FIGS. 12(a) and (b) for comparison. It is observed that their −3-dB bandwidth and gain around $\omega_s$ fit well with each other, since the loading from the mutual coupling between the SC for IB signal is less an issue than that of OB blockers. As expected, the ultimate rejection in FIG. 11(a) is better than that in FIG. 1(a). Note that the parasitic capacitances $C_{in}$ at $V_i$ and $C_o$ at $V_o$ have been included in FIG. 11(b). Also, to account $C_{gs}$ of the $G_m$'s two MOSFETs [FIG. 1(a)], a parasitic capacitance $C_f$ is placed in parallel with $R_{F1}$. Still, the accuracy of the equivalent circuit is acceptable around $f_s$, as shown in FIGS. 13(a) and (b). It is noteworthy that the gain at around $\omega_s$ fits better with each other than that of $\omega_s$, 3$\omega_s$, etc. For the influence of $C_{in}$ and $C_o$, it mainly lowers the IB gain and slightly shifts the resonant frequency. For $C_f$, it induces Miller equivalent capacitances at $V_i$ and $V_o$, further lowering the gain and shifting the center frequency. With (28) and the RLC model, the −3-dB bandwidth at $V_i$ is derived as, $$2\Delta f_{i3dB} = \dfrac{1}{4\pi\left(R_s//\dfrac{R_{F1}+R_L}{1+g_mR_L}\right)C_{ie}}.$$

III. Design Example

A 4-path GB-BPF suitable for full-band mobile-TV or IEEE 802.11af cognitive radio is designed and simulated with 65-nm GP CMOS technology. The circuit parameters are summarized in Table I. The transistor sizes for the self-biased inverter-based $G_m$ are: $(W/L)_{PMOS}$=(24/0.1)×4 and $(W/L)_{NMOS}$=(12/0.1)×4. The 0.1-μm channel length is to raise the gain for a given power and $g_m$ value. The switches are NMOS with $(W/L)_{sw}$=25/0.06. $C_i$ is realized with MiM capacitor.

Figure 14A:
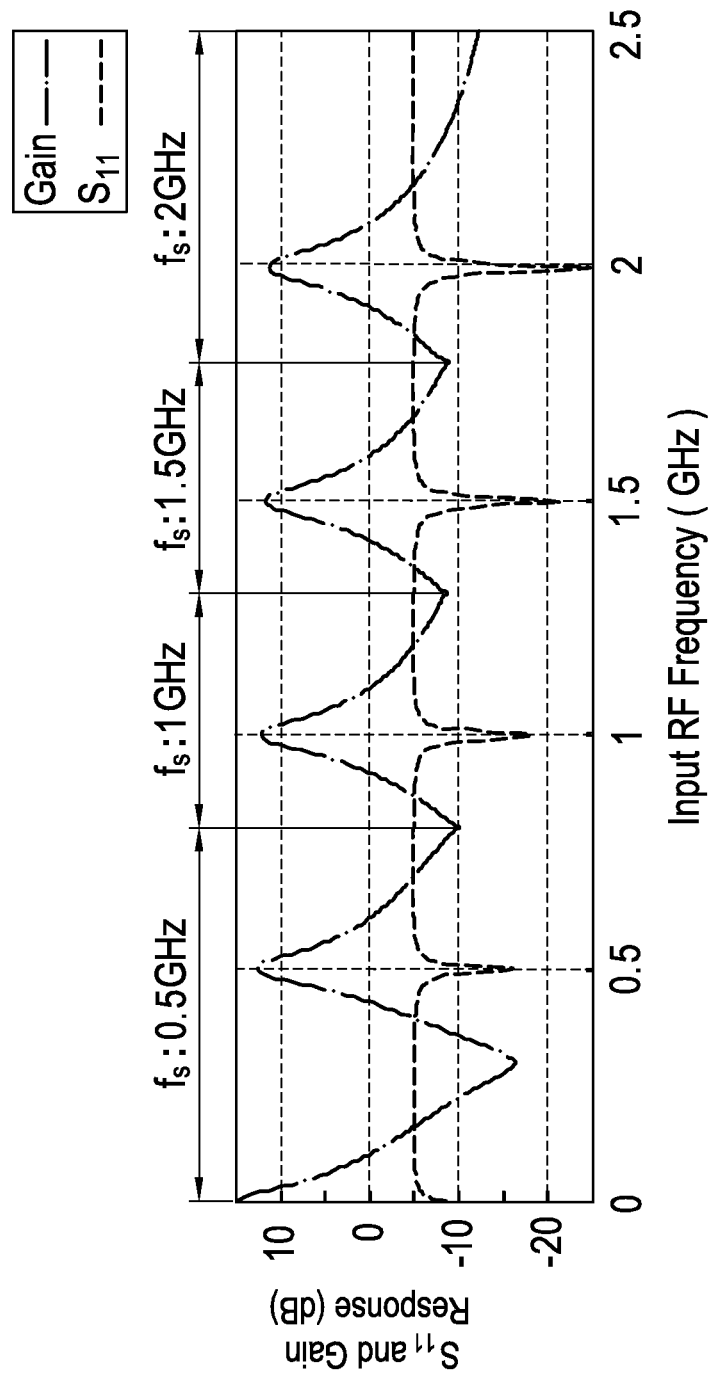
FIG. 14(a) illustrates a simulated voltage gain and S11 with different fs showing the LO-defined bandpass responses.
Figure 14B:
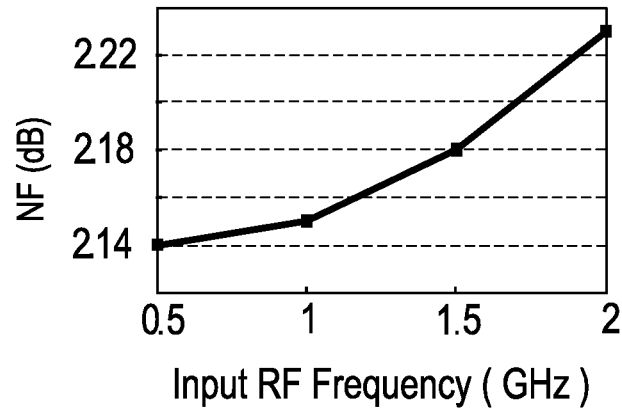
FIG. 14(b) illustrates a simulated NF versus input RF frequency.
Figure 14C:
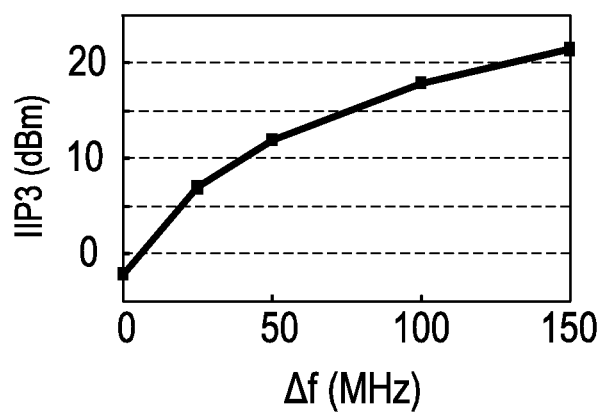
FIG. 14(c) illustrates a IB and OB IIP3.

As shown in FIG. 14(a), the passband is LO-defined under $f_s$=0.5, 1, 1.5 and 2 GHz and $S_{11}$>−15 dB in all cases. The −3-dB BW ranges between 41 to 48 MHz, and is achieved with a total MiM capacitance of 20 pF. The calculated $C_{ie}$ based on (28) is thus ~40 pF, and the required $C_{ie}$ for 4 paths is 160 pF. The −3-dB BW at 2 GHz is larger due the parasitic capacitor that reduces the Q of the GB-BPF. The gain is 12.5 dB at 0.5-GHz RF, which drops to 11 dB at 2-GHz RF with an increase of NF by <0.1 dB as shown in FIG. 14(b). The IIP3 improves from IB (−2 dBm) to OB (+21.5 dBm at 150-MHz offset) as shown in FIG. 14(c). For the circuit non-idealities, 10% of LO duty cycle mismatch only induce a small variation of IB gain by around 0.05 dB. For a $g_m$ variation of 10%, the IB gain variation is 0.07 dB at 500-MHz LO frequency. The performance summary is given in Table II.

TABLE I

KEY PARAMETERS IN THE DESIGN EXAMPLE.

| $g_m$ (mS) | $R_{sw}$ (Ω) | $R_{F1}$ (Ω) | $R_L$ (Ω) | $C_i$ (pF) |
|---|---|---|---|---|
| 76 | 20 | 1k | 120 | 5 |

TABLE II

SIMULATED PERFORMANCE SUMMARY IN 65-NM CMOS.

| | |
|---|---|
| Tunable RF (GHz) | 0.5 to 2 |
| Gain (dB) | 11 to 12.5 |
| NF (dB) | 2.14 to 2.23 |
| IIP3$_{IB}$ (dBm)* | −2 |
| IIP3$_{OB}$ (dBm) (Δf = +25 MHz)* | +7 |
| IIP3$_{OB}$ (dBm) (Δf = +50 MHz)* | +12 |
| IIP3$_{OB}$ (dBm) (Δt = +100 MHz)* | +18 |
| IIP3$_{OB}$ (dBm) (Δf = +150 MHz)* | +21.5 |
| BW (MHz) | 41 to 48 |
| Power (mW) @ Supply (V) | 7 @ 1 |

*$f_s$ = 500 MHz, two tones at $f_s$ + Δf + 2 MHz and $f_s$ + 2Δf + 4 MHz.

IV. Conclusions

The present invention has described the analysis, modeling and design of a GB-BPF that features a number of attractive properties. By using a transconductance amplifier ($G_m$) as the forward path and an N-path SC branch as its feedback path, double RF filtering at the input and output ports of the $G_m$ is achieved concurrently. Further, when designed for input impedance matching, both in-band gain and bandwidth can be customized due to the flexibility created by $G_m$. Both the power and area efficiencies are improved when compared with the traditional passive N-path filter due the loop gain offered by $G_m$. All gain and bandwidth characteristics have been verified using a RLC model first, and later with the LPTV analysis to derive the R, L and C expressions. The harmonic selectivity, harmonic folding and noise have been analyzed and verified by simulations, revealing that the noise of the switches is notched at the output, benefitting the use of small switches for the SC branch, saving the LO power without sacrificing the selectivity. The design example is a 4-path GB-BPF. It shows >11 dB gain, <2.3-dB NF over 0.5-to-2-GHz RF, and +21-dBm out-of-band IIP3 at 150-MHz offset, at just 7 mW of power. The developed models also backup the design of the ultra-low-power receiver in for multi-band sub-GHz ZigBee applications.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A gain-boosted n-path bandpass filter, comprising:
a transconductance amplifier serving as a forward path;
a node one, connected to an input of the transconductance amplifier;
node two, connected to an output of the transconductance amplifier;
a clock source to provide non-overlap clocks; and
a n-path switched-capacitor (sc) branch serving as a feedback path, connected between the node one and the node two and parallel to the transconductance amplifier;
wherein the n-path sc branch comprises a plurality of switches and capacitors connected in series;
wherein there are no elements between the node one and the node two other than the switches and capacitors connected in series;
wherein the switches of the n-path sc branch are driven by the non-overlap clocks, respectively.

2. The gain-boosted n-path bandpass filter according to claim 1, wherein when the state of the switches is ON, an in-phase voltage of the transconductance amplifier will appear on top plates of the capacitors, and induce an amplified anti-phase voltage into bottom plates of the capacitors.

3. The gain-boosted n-path bandpass filter according to claim 2, wherein when the state of the switch is OFF, the amplified anti-phase voltage will be stored in the capacitors.

4. The gain-boosted n-path bandpass filter according to claim 1, wherein n can be any integer number equal to or greater than 1.

* * * * *